United States Patent
Tasumi et al.

(10) Patent No.: US 7,872,410 B2
(45) Date of Patent: Jan. 18, 2011

(54) LIGHT EMITTING DEVICE AND LIGHT EMITTER

(75) Inventors: Koji Tasumi, Aichi-ken (JP); Yoshinobu Suehiro, Aichi-ken (JP); Seiji Yamaguchi, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 127 days.

(21) Appl. No.: 12/081,392

(22) Filed: Apr. 15, 2008

(65) Prior Publication Data

US 2008/0284315 A1  Nov. 20, 2008

(30) Foreign Application Priority Data

Apr. 16, 2007 (JP) ............... 2007-107461
Feb. 26, 2008 (JP) ............... 2008-044444
Apr. 3, 2008 (JP) ............... 2008-097342

(51) Int. Cl.
*H01J 63/04* (2006.01)

(52) U.S. Cl. .................................... 313/503

(58) Field of Classification Search ......... 313/483–485, 313/498–503; 362/84; 345/36, 37, 41, 60
See application file for complete search history.

(56) References Cited

U.S. PATENT DOCUMENTS 5,670,797 A * 9/1997 Okazaki .................. 257/91
6,791,116 B2   9/2004 Takahashi et al.
2006/0049421 A1 * 3/2006 Suehiro et al. ............ 257/99
2006/0261364 A1  11/2006 Suehiro et al.
2006/0291226 A1 * 12/2006 Daicho et al. ............ 362/509
2007/0064131 A1 * 3/2007 Sawanobori et al. ....... 348/294

FOREIGN PATENT DOCUMENTS

JP   2004-111882    4/2004
JP   2005-93896     4/2005
WO   WO 2004/082036 A1  9/2004

* cited by examiner

*Primary Examiner*—Karabi Guharay
*Assistant Examiner*—Brenitra M Lee
(74) *Attorney, Agent, or Firm*—McGinn IP Law Group, PLLC

(57) ABSTRACT

A light emitting device includes a light emitting element, a substrate with a flat mounting surface for mounting the light emitting element thereon, a sealing part for the light emitting element on the mounting surface of the substrate. The sealing part is formed of glass including a phosphor to be excited by light emitted from the light emitting element to radiate a wavelength conversion light. The sealing part is shaped like a rectangular solid wherein a lateral length is defined as a distance between a center of a bottom surface of the sealing part bonded to the mounting surface and a side face perpendicular to the mounting surface, a vertical length is defined as a distance between the mounting surface and a top surface of the sealing part, and at least one of the lateral length is longer than the vertical length. The device further includes a transparent member formed on the top surface of the sealing part. The transparent member includes the phosphor at a concentration higher than the sealing part.

24 Claims, 20 Drawing Sheets

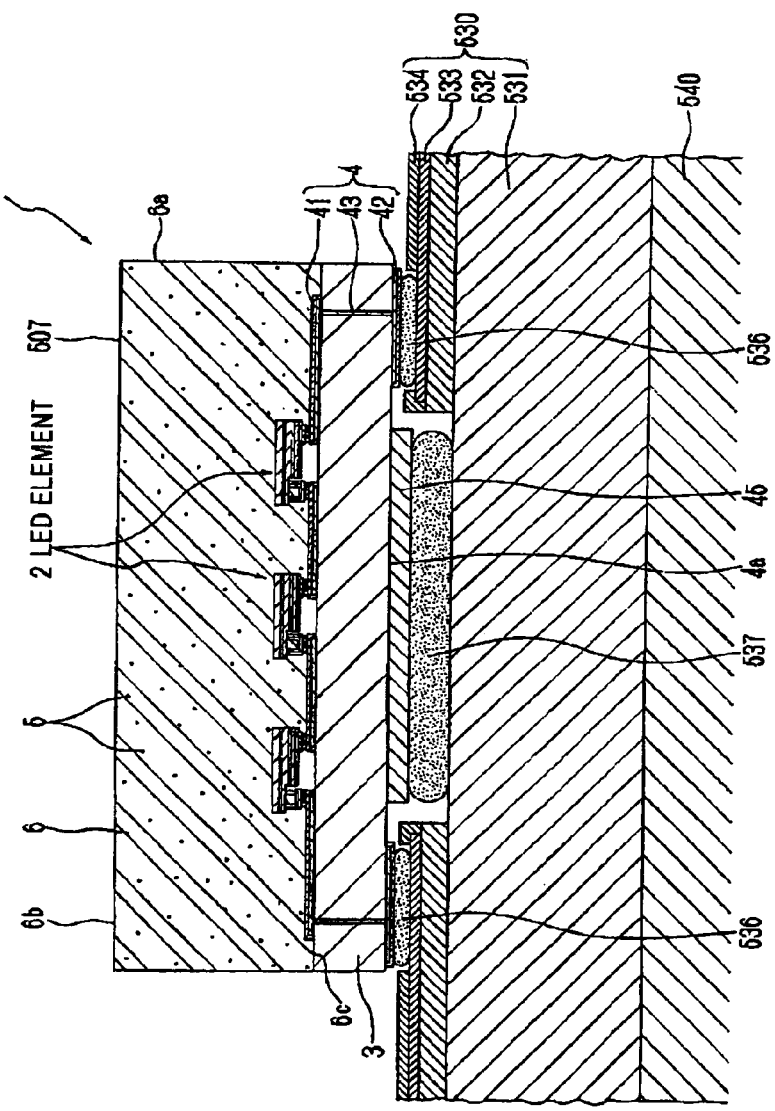

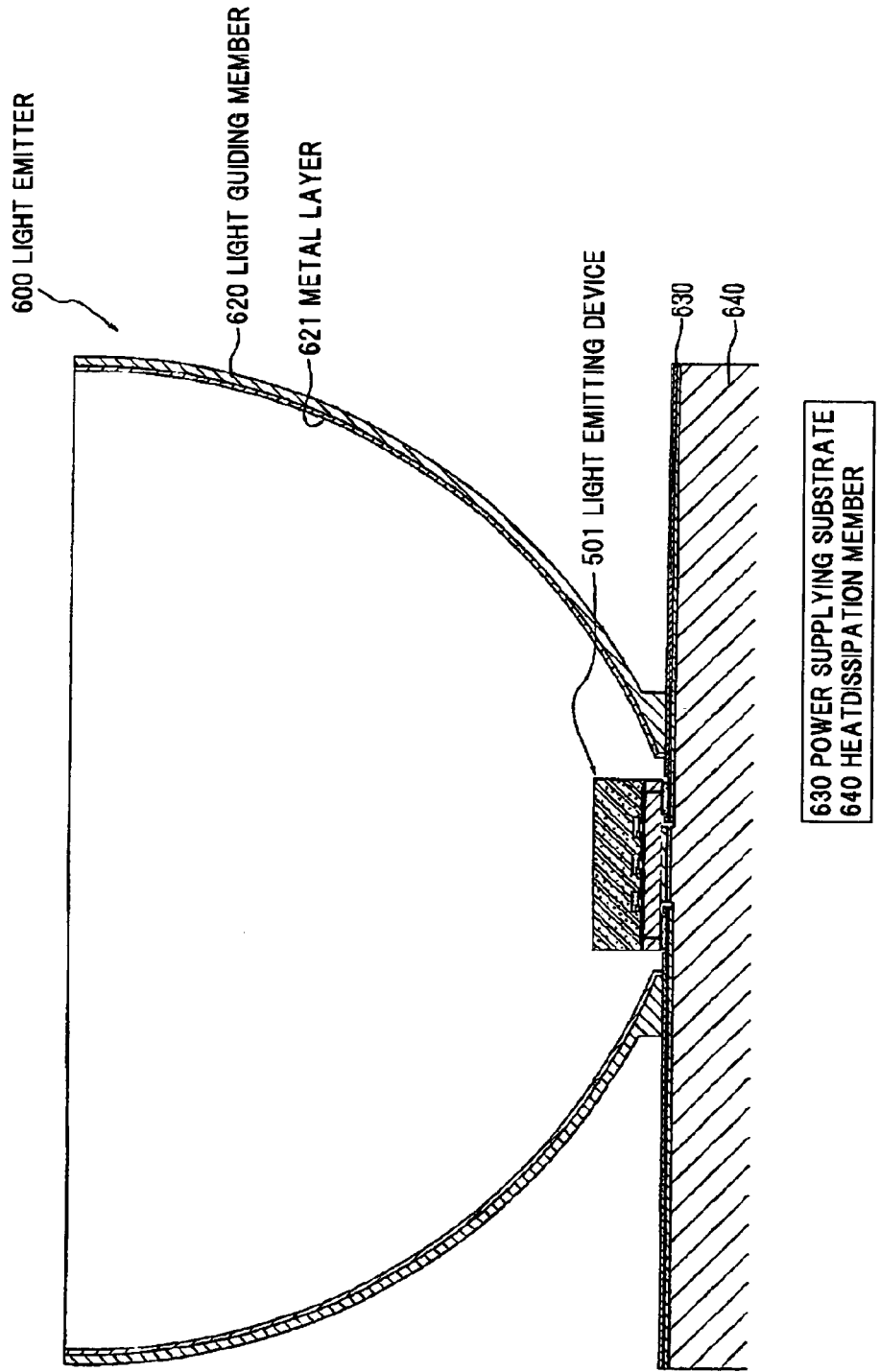

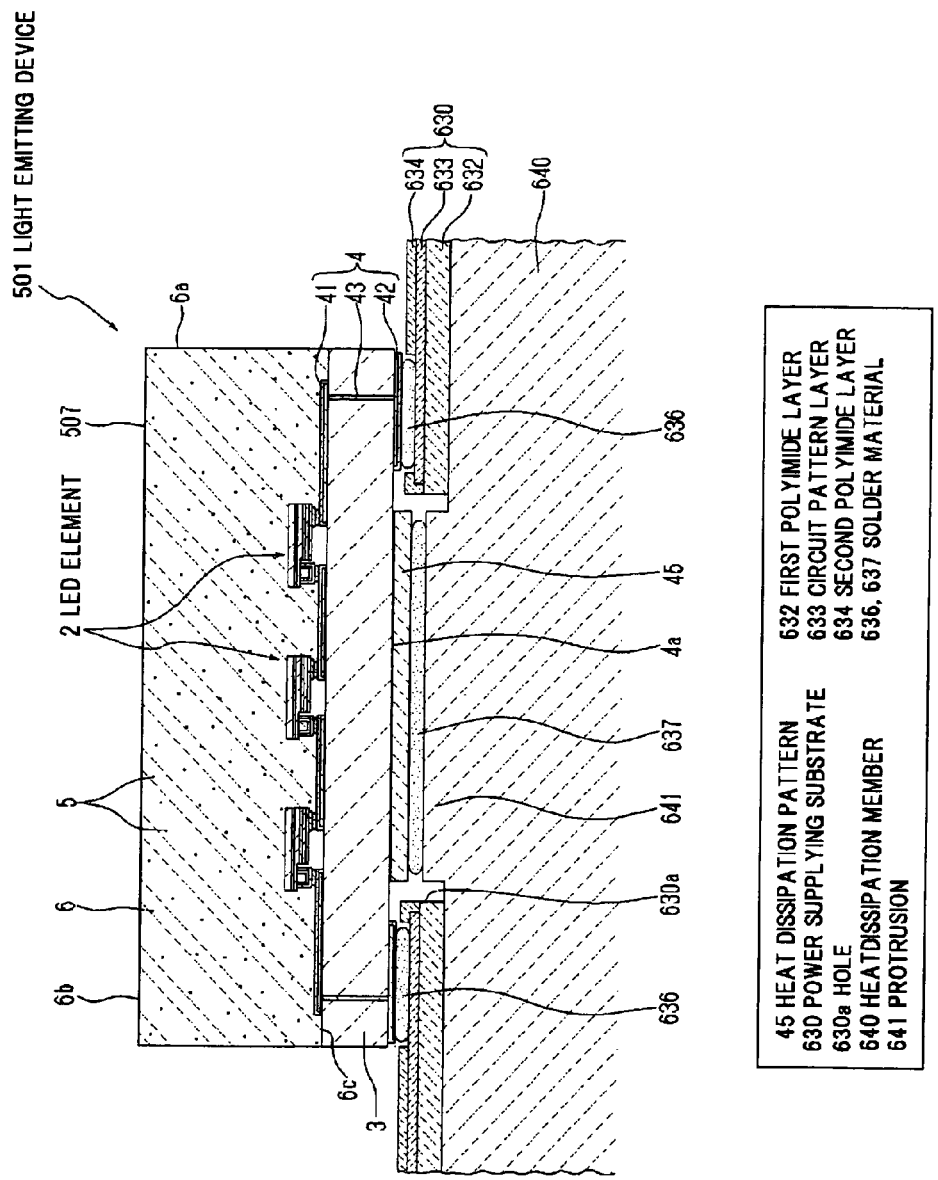

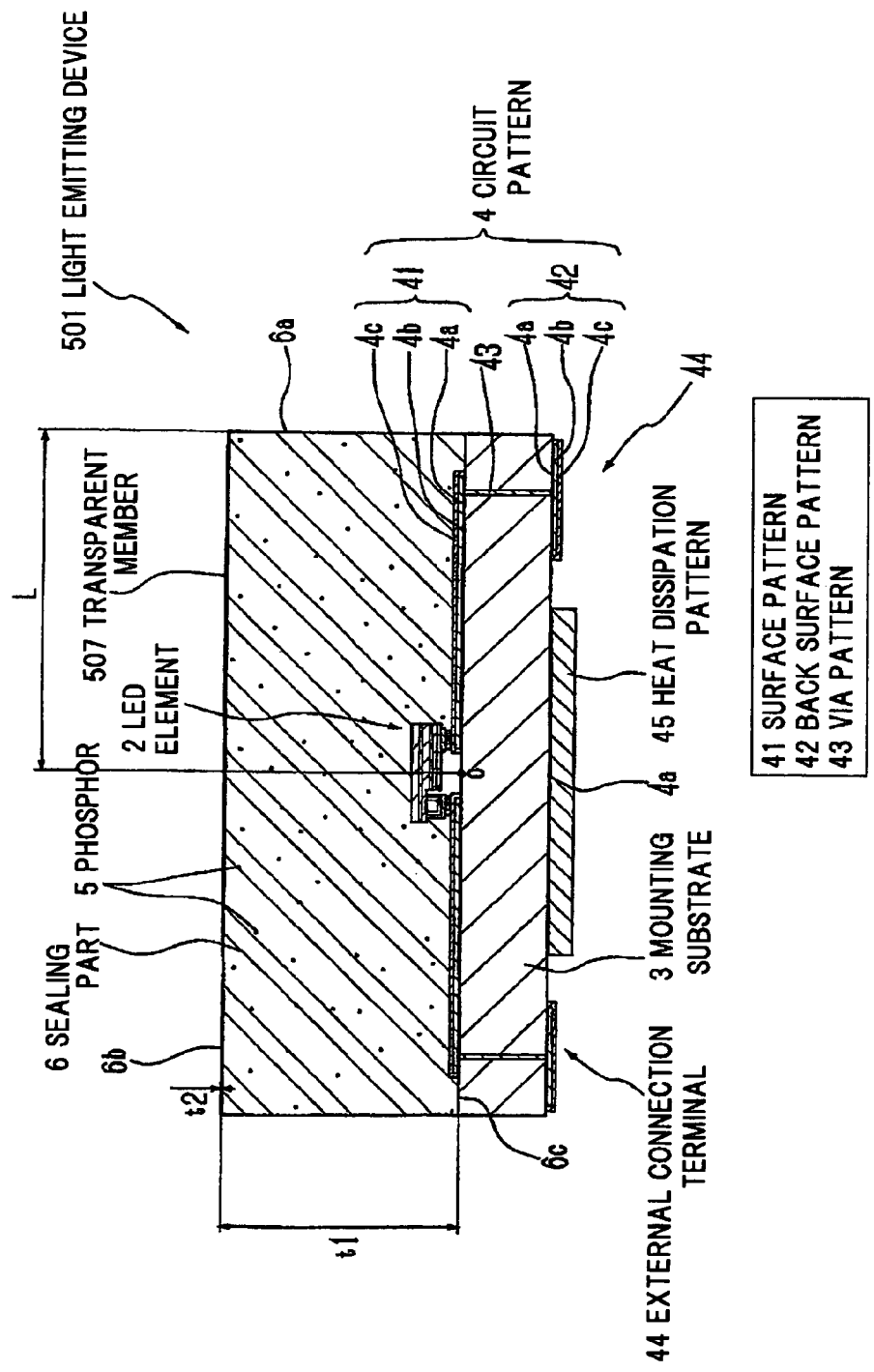

LIGHT EMITTING DEVICE AND LIGHT EMITTER

The present application is based on Japanese patent applications Nos. 2007-107461, 2008-044444 and 2008-097342 filed on Apr. 16, 2007, Feb. 26, 2008 and Apr. 3, 2008, respectively, the entire contents of which are incorporated herein by reference.

BACKGROUND OF THE INVENTION

1. Field of the Invention

This invention relates to a light emitting device that a light emitting element is mounted on a base material and sealed with rectangular solid glass. Also, this invention relates to a light emitter using the light emitting device.

2. Description of the Related Art

Conventionally, a light emitting device is known in which a light emitting element such as an LED (light emitting diode) is sealed with a transparent resin material such as epoxy or silicone-based material. Such a light emitting device includes a practical light emitting device that a ultraviolet, violet or blue LED chip is used as the light emitting element, and a phosphor to be excited by light emitted from the light emitting element is mixed into the transparent resin material so as to obtain white light (See JP-A-2004-111882 and JP-A-2005-093896).

JP-A-2004-111882 discloses a light emitting device that an LED chip is mounted at the bottom of a concave reflection mirror, a low-concentration resin layer including a phosphor at low concentration is formed up to the top surface of the LED chip and a high-concentration resin layer including a phosphor at high concentration is formed on the low-concentration resin layer. The form and the phosphor concentration of the low-concentration resin layer and the high-concentration resin layer are adjusted such that a value is substantially constant which is given by multiplying by the concentration of the phosphor the optical path length of light emitted from the LED chip until reaching the interface of the high-concentration resin layer and an external resin material.

JP-A-2005-093896 discloses a light emitting device that an LED chip is mounted at the bottom of a concave portion formed in a base material, a first wavelength conversion material with a phosphor dispersed therein is filled halfway in the concave portion, and a second wavelength conversion material with a higher phosphor concentration than the first wavelength conversion material is filled on the first wavelength conversion material.

However, the light emitting devices of JP-A-2004-111882 and JP-A-2005-093896 have a problem that the transparent resin material is likely to deteriorate by light or heat discharged from the light emitting element. Especially, when using the light emitting element of group III nitride-based compound semiconductor to emit a short wavelength light, the transparent resin material near the element may be yellowed by high-energy light and heat from the light emitting element, so that the light extraction efficiency deteriorates with time.

WO-2004/082036 A1 discloses a light emitting device that glass is used as its sealing material so as to prevent the deterioration of the sealing material. In this light emitting device, a plate glass material is bonded by hot pressing onto a ceramic substrate on which an LED chip is mounted so as to seal the LED chip. After the hot pressing, the glass with the substrate is separated or cut by using a dicer etc. so that a glass sealing part is shaped like a rectangular solid on the substrate.

In the light emitting device of WO-2004/082036 A1, since the glass sealing part is formed by cutting the glass material by the dicer during the production, it is preferable to use the thinner glass material so as to prolong the exchange time of the blade of the dicer. Further, in case of using the glass sealing part including a phosphor, since the glass material with phosphor dispersed therein is expensive, it is preferable to use the thinner glass material so as to reduce the manufacturing cost.

However, in case of the thinner glass sealing part with the phosphor dispersed therein, unevenness in emission color will be caused. This is because the distance from the mounting location of the LED chip to the side surface of the glass sealing part is shorter than that to the upper surface of the glass sealing part, so that chromaticity difference is produced between light discharged from the upper surface of the glass sealing part and light discharged from the side surface of the glass sealing part. For example, if light discharged from the upper surface of the glass sealing part is set to be white light, light discharged from the side surface thereof will be yellowish. If light discharged from the side surface of the glass sealing part is set to be white light, light discharged from the upper surface thereof will be bluish.

SUMMARY OF THE INVENTION

It is an object of the invention to provide a light emitting device that, even when the glass sealing part including the phosphor is shaped like a rectangular solid, unevenness in emission color can be significantly suppressed.

It is a further object of the invention to provide a light emitter using the light emitting device.

(1) According to one embodiment of the invention, a light emitting device comprises:

a light emitting element;

a substrate comprising a flat mounting surface for mounting the light emitting element thereon;

a sealing part for the light emitting element on the mounting surface of the substrate, the sealing part comprising glass including a phosphor to be excited by light emitted from the light emitting element to radiate a wavelength conversion light, the sealing part being shaped like a rectangular solid wherein a lateral length is defined as a distance between a center of a bottom surface of the sealing part bonded to the mounting surface and a side face perpendicular to the mounting surface, a vertical length is defined as a distance between the mounting surface and a top surface of the sealing part, and at least one of the lateral length is longer than the vertical length; and a transparent member formed on the top surface of the sealing part, the transparent member including the phosphor at a concentration higher than the sealing part.

In this light emitting device, when light is radially radiated from the light emitting element, a part of light is wavelength-converted by the phosphor included in the sealing part and discharged outside the sealing part. In such a case, since at least of the lateral lengths of the sealing part is formed longer than the vertical length, the light-propagating distance of light emitted laterally from the light emitting element becomes longer. As a result, light heading to the at least one side face of the sealing part is higher in wavelength-converted rate than light heading to the top surface of the sealing part.

Although the light heading to the side face of the sealing part is externally discharged through the side face, the light heading to the top surface of the sealing part further enters in the transparent member. The light entered in the transparent member is partly wavelength-converted and externally discharged outside the device. Thus, difference in wavelength-converted rate can be reduced between the light discharged from the side faces and the light discharged from the transparent member. Here, the vertical dimension of the transparent member is smaller than the difference between the lateral length and the vertical length of the sealing part. Therefore, even if the transparent member has the same phosphor concentration as the sealing part, difference in chromaticity will be still yielded. However, since the transparent member has the phosphor concentration higher than the sealing part, the difference in chromaticity can be reduced between light discharged from the side faces of the sealing part and light discharged from the transparent member.

In the above embodiment (1), the following modifications, changes and a combination thereof can be made.

(i) The transparent member comprises a vertical dimension thereof in a direction perpendicular to the mounting surface, the vertical dimension is smaller than a difference between the lateral length and the vertical length, and the light emitting element comprises a plurality of light emitting elements.

In the above device, since the vertical dimension of the transparent member is smaller than the difference between the lateral length and the vertical length of the sealing part, the device can be downsized as well as the reduced difference in chromaticity. Further, in the above device, the lateral length tends to be longer than the vertical length since there are plural LED elements mounted on the mounting surface of the mounting substrate and the sealing part is formed along the entire mounting surface to seal all the LED elements. Thus, the difference in chromaticity is easy to yield between lights discharged externally. However, as described above, even in the composition easy to yield the difference in chromaticity, the difference in chromaticity can be almost eliminated between light discharged from the side faces of the sealing part and light discharged from the transparent member. Therefore, the amount of light can be increased by providing for the plural LED elements while reducing unevenness in emission color of light discharged externally, and the vertical dimension to the mounting substrate of the device can be downsized. Thus, the light emitting device of this embodiment can be advantageous in practical use.

(ii) The substrate comprises a heat dissipation pattern on a back surface opposite the mounting surface, and the light emitting device further comprises a heat dissipation member connected directly or indirectly to the heat dissipation pattern.

(iii) The transparent member comprises glass.

(iv) The transparent member further comprises inorganic paste.

(v) The sealing part comprises the top surface and the bottom surface which are both shaped like a square, and the two lateral lengths of the sealing part are equal to each other.

In the above device, since the lateral lengths are equal, the chromaticity can be nearly equalized for lights emitted from any side faces of the sealing part.

(vi) The sealing part comprises the top surface and the bottom surface which are both shaped like a rectangle with an elongated side in a direction, and the sealing part further comprises a reflection member on the elongated side.

(vii) The transparent member further comprises resin.

(viii) The light emitting element is adapted to emit light with a wavelength not more than 410 nm, and the phosphor is adapted to radiate blue, green and red lights as the wavelength conversion light.

(ix) The light emitting element is adapted to emit light in a blue region, and the phosphor is adapted to radiate yellow light as the wavelength conversion light.

(x) 40% or more of the mounting surface of the substrate is covered with silver.

(xi) The device satisfies the relationship: $L \times a = t1 \times a + t2 \times b$, where L represents the lateral length L of the sealing part, t1 represents the vertical length of the sealing part, 'a' represents the concentration of the phosphor per unit volume in the sealing part, t2 represents the vertical dimension of the transparent member, and 'b' represents the concentration of the phosphor per unit volume in the transparent member.

(xii) The rate of wavelength-converted light in a material containing the phosphor is determined by multiplying the light-propagating distance by the phosphor concentration. In the above device, provided that lights are radially radiated from the center 'O', the wavelength-converted rate, ($L \times a$), for light externally discharged perpendicularly through the side faces of the sealing part is nearly equal to the wavelength-converted rate, ($t1 \times a + t2 \times b$), for light externally discharged through the transparent member. Thus, the difference in chromaticity can be almost eliminated between light discharged from the side faces of the sealing part and light discharged from the transparent member.

(2) According to another embodiment of the invention, a light emitter comprises:

the light emitting device as described above; and an emission surface to cause emission of light emitted from the light emitting device.

The above light emitter allows light from the light emitting device to be imaged on the irradiated surface. Where there is provided the irradiated surface, a viewer can sensitively sense unevenness in chromaticity since the difference in chromaticity of light emitted from the light emitting device is also imaged thereon. However, since the light emitting device of the light emitter has the reduced difference in chromaticity as described above, light with the reduced difference in chromaticity can be imaged on the irradiated surface so that the viewer can sense the image with uniform chromaticity.

BRIEF DESCRIPTION OF THE DRAWINGS

The preferred embodiments according to the invention will be explained below referring to the drawings, wherein:

FIG. 17 is an enlarged cross sectional view showing a part of the light emitter in FIG. 15;

FIG. 18 is a cross sectional view showing a light emitter in a seventh preferred embodiment according to the invention;

FIG. 19 is an enlarged cross sectional view showing a part of the light emitter in FIG. 18; and FIG. 20 is a cross sectional view showing a light emitting device in modification according to the invention.

DETAILED DESCRIPTION OF THE PREFERRED EMBODIMENTS

First Embodiment

Figure 1:
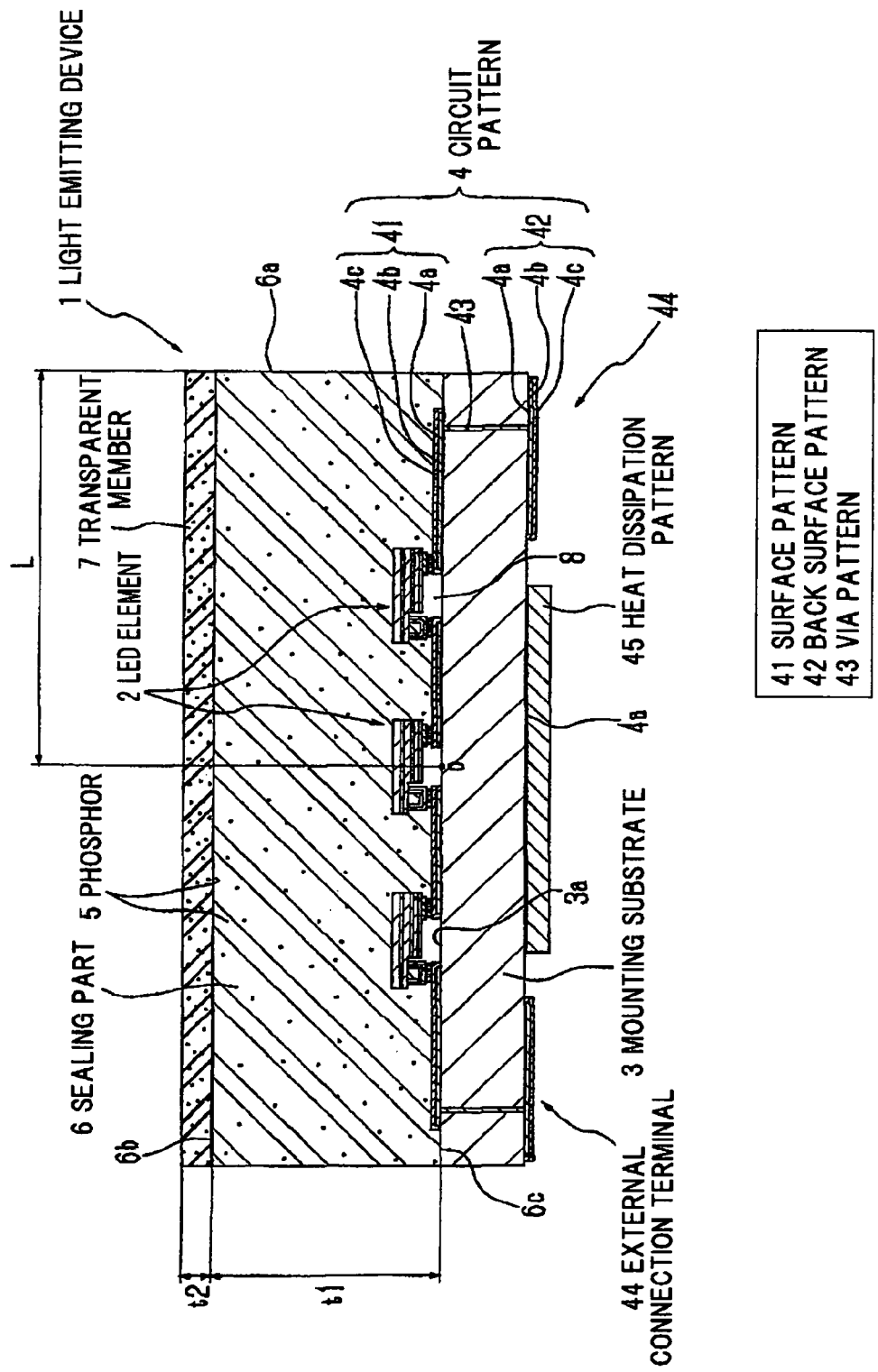
FIG. 1 is a cross sectional view showing a light emitting device in a first preferred embodiment according to the invention.
Figure 2:
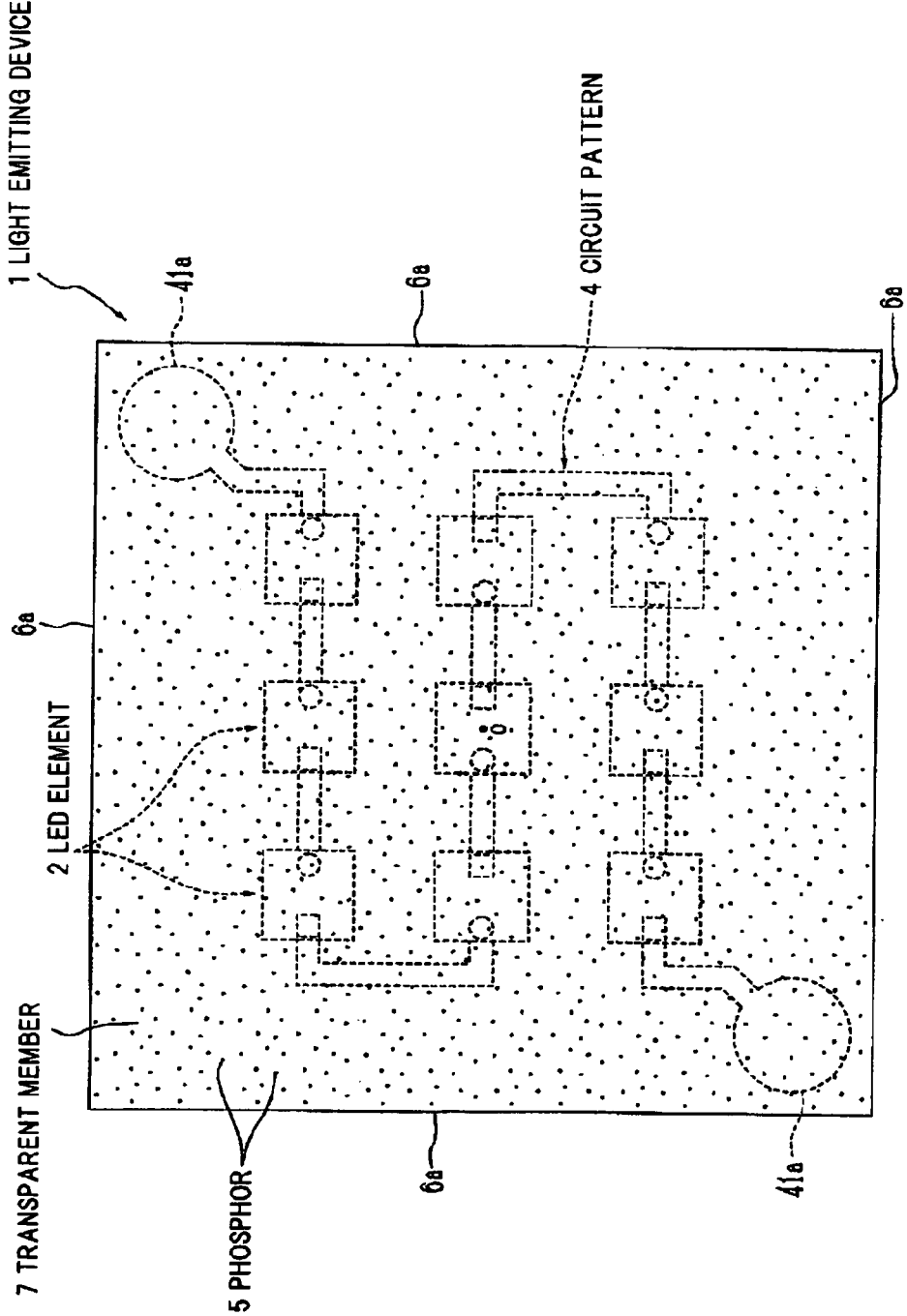
FIG. 2 is a top view showing the light emitting device in FIG. 1.
Figure 3:
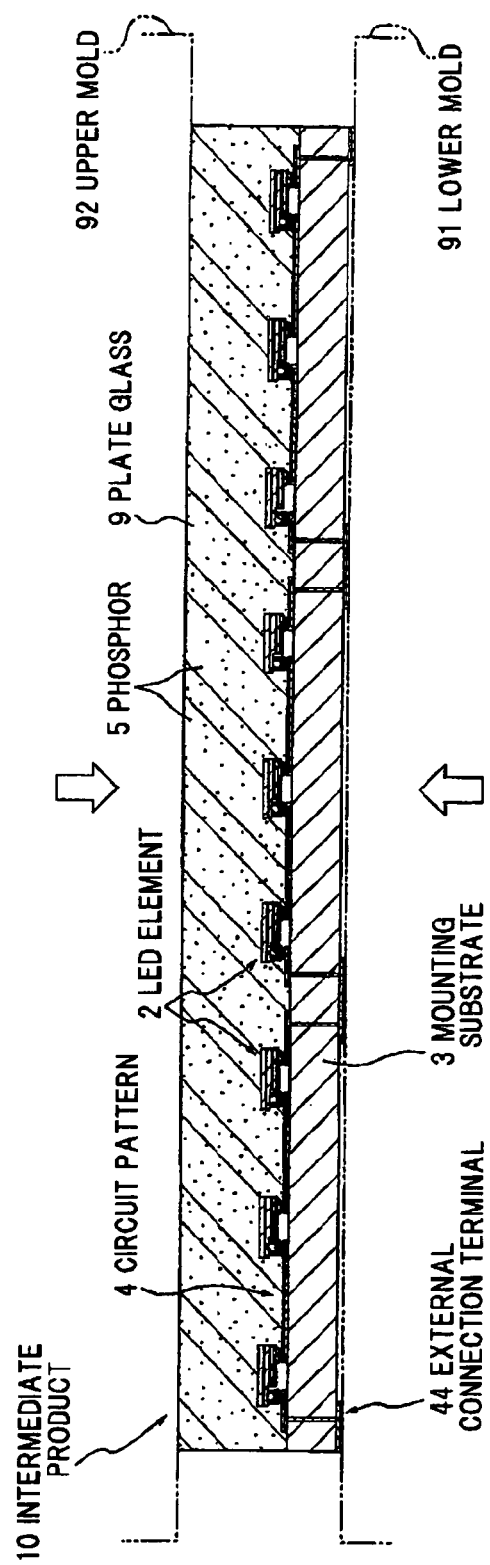
FIG. 3 is a cross sectional view showing an intermediate product before it is separated into plural light emitting devices by a dicer.

FIGS. 1 to 3 each shows the first preferred embodiment of the invention, where FIG. 1 is a cross sectional view showing a light emitting device of the first preferred embodiment according to the invention.

As shown in FIG. 1, the light emitting device 1 comprises plural flip-chip type LED elements 2 formed of GaN-based semiconductor material, a mounting substrate 3 with a mounting surface 3a on which the LED elements 2 are mounted, a circuit pattern 4 formed on the mounting substrate 3 and formed of tungsten (W)-nickel (Ni)-gold (Au), a sealing part 6 for sealing the LED elements 2 on the mounting surface 3a of the mounting substrate 3 and formed of glass with phosphor 5 dispersed therein, and a transparent member 7 formed on the sealing part 6 and having the phosphor 5 dispersed therein. Between the LED elements 2 and the mounting substrate 3, a space 8 is formed into which no glass penetrates.

The LED elements 2 as a light emitting element are fabricated by epitaxially growing group III nitride-based semiconductor on a growth substrate of sapphire ($Al_2O_3$) such that a buffer layer, an n-type layer, an MQW layer and a p-type layer are formed thereon. The LED element 2 is epitaxially grown at temperature more than 700° C. and has allowable temperature limit more than 600° C. such that it is stable at processing temperature of a sealing process using heat melting glass as described later. The LED element 2 is provided with a p-side Rh electrode formed on the surface of the p-type layer, a p-pad electrode formed on the p-side Rh electrode, and an n-side electrode formed on the n-type layer exposed by etching a part thereof from the p-type layer to the n-type layer. Au bumps are formed on the p-side pad electrode and the n-side electrode, respectively.

The LED elements 2 are each 100 μm in thickness and 346 μm square in chip size, and $7\times10^{-6}/°$ C. in thermal expansion coefficient. Although the GaN layer of the LED element 2 is $5\times10^{-6}/°$ C. in thermal expansion coefficient, the thermal expansion coefficient of the whole LED element 2 is substantially the same as that of the growth substrate 20 since the sapphire growth substrate 20 composing the majority thereof is $7\times10^{-6}/°$ C. in thermal expansion coefficient.

The mounting substrate 3 is formed of alumina ($Al_2O_3$) polycrystalline sintered material, formed 0.25 mm in thickness, shaped like a square with a side of 2.7 mm, and $7\times10^{-6}/°$ C. in thermal expansion coefficient ($\alpha$). As shown in FIG. 1, the circuit pattern 4 of the mounting substrate 3 is composed of a surface pattern 41 formed on the top surface of the substrate 3 and electrically connected to the LED elements 2, and a back surface pattern 42 formed on the bottom surface of the substrate 3 and adapted to be connected to an external terminal. The surface pattern 41 comprises a W layer 4a patterned according to the shape of the electrode of the LED elements 2, a thin-film Ni layer 4b covering the surface of the W layer 4a, and a thin-film Au layer 4c covering the surface of the Ni layer 4b. The surface pattern 41 and the back surface pattern 42 are electrically connected each other through a via pattern 43 which is formed of W and formed in a via hole penetrating the mounting substrate 3 in thickness direction. Further, a heat dissipation pattern 45 for externally dissipating heat generated from the LED elements 2 is formed opposite the mounting surface 3a of the mounting substrate 3. The heat dissipation pattern 45 is formed in the same process as the back surface pattern 42 and composed of a W layer 4a.

The sealing part 6 is formed of $ZnO$—$B_2O_3$—$SiO_2$—$Nb_2O_3$—$Na_2O$—$Li_2O$-based heat melting glass with the phosphor 5 uniformly dispersed therein. The composition of the glass is not always limited to this, and the heat melting glass may not include $Li_2O$ and optionally include $ZrO_2$, $TiO_2$ etc. As shown in FIG. 1, the sealing part 6 is shaped like a rectangular solid on the mounting substrate 3. The side face 6a of the sealing part 6 is formed by cutting by using a dicer a plate glass with the mounting substrate 3 bonded thereto by hot pressing. The top surface 6b of the sealing part 6 is a surface of the plate glass bonded to the mounting substrate 3 by hot pressing.

In this embodiment, the sealing part 6 is formed such that lateral length L from the center O of its lower surface 6c where the sealing part 6 is bonded to the mounting surface 3a to the side face 6a perpendicular to the mounting surface 3a is longer than vertical length t1 up to the top surface 6b opposite the mounting surface 3a. For example, the lateral length L is 1.35 mm and the vertical length t1 is 0.75 mm.

The heat melting glass for the sealing part 6 is 490° C. in glass transition temperature (Tg) and 520° C. in yielding point, where the glass transition temperature (Tg) is sufficiently lower than formation temperature for forming the epitaxial layer of the LED element 2. In this embodiment, the glass transition temperature (Tg) is by 200° C. or more lower than the formation temperature. The thermal expansion coefficient ($\alpha$) of the heat melting glass is $6\times10^{-6}/C$ at temperature of 100° C. to 300° C. The thermal expansion coefficient ($\alpha$) becomes larger than this value beyond the glass transition temperature (Tg). This allows the heat melting glass to be processed by hot pressing to be bonded to the mounting substrate 3 at 600° C. The heat melting glass for the sealing part 6 is 1.7 in refractive index.

The composition of the heat melting glass can be arbitrarily determined if the glass transition temperature (Tg) thereof is lower than the allowable temperature limit of the LED element 2 and the thermal expansion coefficient ($\alpha$) thereof is approximately the same as the mounting substrate 3. Glasses with a relatively small glass transition temperature (Tg) and a relatively small thermal expansion coefficient (α) can include, e.g., ZnO—SiO$_2$—R$_2$O based glass (where R is at least one selected from group I elements such as Li, Na and K), phosphate-based glass, lead glass etc. Of these glasses, the ZnO—SiO$_2$—R$_2$O based glass is preferable since it is better in humidity resistance than the phosphate-based glass and does not cause environmental problem as in the lead glass.

The heat melting glass is glass formed while being melted or softened by heating and is different from glass, i.e., sol-gel glass, formed by the sol-gel process. The sol-gel glass can cause a crack due to its big volume change in formation and therefore it is difficult to form the sol-gel glass into a thick film. However, the heat melting glass can avoid this problem. Further, the sol-gel glass is likely to be porous so that it may be poor in airtightness. However, the heat melting glass does not cause this problem so that the LED elements 2 can be surely sealed.

The heat melting glass is generally processed at a different order of viscosity much higher than resin with a high viscosity level. In case of the glass, even if beyond the yielding point by several tens of ° C., the viscosity cannot be reduced down to the general resin sealing level. If the viscosity is brought to the general resin sealing level by heating at high temperature beyond the crystal growth temperature of the LED element, it will stick to the mold and therefore it is difficult to handle it in sealing and molding process. Therefore, it is preferable to process the heat melting glass at $10^4$ poise or higher.

The phosphor 5 is a yellow phosphor to emit yellow light with a peak wavelength in yellow wavelength range when being excited by blue light emitted from the MQW layer of the LED elements 2. In this embodiment, the phosphor 5 is formed of YAG (yttrium aluminum garnet) and has an average particle diameter of 10 μm in the sealing part 6. The phosphor 5 may be a silicate phosphor, or a combined phosphor of YAG and silicate at a given ratio. In this embodiment, the concentration 'a' of the phosphor 5 in the sealing part 6 is 2.6 volume %.

The transparent member 7 is formed on the top surface 6b of the sealing part 6 and the same phosphor 5 as dispersed in the sealing part 6 is dispersed therein. The transparent member 7 is formed of an inorganic paste coated on the top surface 6b of the sealing part 6. The inorganic paste for the transparent member 7 is formed of, e.g., SiO$_2$, Al$_2$O$_3$ etc. Where the transparent member 7 is coated at a thickness of 0.1 mm, a dimension 't2' in the direction vertical to the mounting surface 3a and the top surface 6b is 0.1 mm. In this embodiment, the difference between the lateral length L (1.35 mm) and the vertical length t1 (0.75 mm) of the sealing part 6 is 0.6 mm. The vertical dimension 't2' of the transparent member 7 is smaller than the difference.

In the transparent member 7, the phosphor 5 is dispersed at a higher concentration than the sealing part 6. In this embodiment, the concentration 'b' of the phosphor 5 in the transparent member 7 is 15.6 volume %.

As such, the light emitting device 1 of this embodiment satisfies the relationship:

$$L \times a = t1 \times a + t2 \times b,$$

where L represents the lateral length L of the sealing part 6, t1 represents the vertical length of the sealing part 6, 'a' represents the concentration of the phosphor 5 per unit volume in the sealing part 6, t2 represents the vertical dimension of the transparent member 7, and 'b' represents the concentration of the phosphor 5 per unit volume in the transparent member 7.

FIG. 2 is a top view showing the light emitting device 1 of the first embodiment. As shown in FIG. 2, the LED elements 2 to emit blue light are arrayed 3×3 in the lengthwise and crosswise directions, such that the nine LED elements 2 are in total mounted on one mounting substrate 3. In this embodiment, the emission peak wavelength of the LED elements 2 is all 460 nm. Of the LED elements 2, the LED element 2 at the center of the lengthwise and crosswise array is located at the center O of the lower surface 6c of the sealing part 6. The other LED elements 2 are disposed symmetrically to the center O in the lengthwise and crosswise directions. Thereby, when the LED elements 2 are driven, lights entering into the four side faces 6a of the sealing part 6 can be equalized. In this embodiment, the interval of the neighboring LED elements 2 in the lengthwise and crosswise directions is set 600 μm.

The LED elements 2 are electrically connected in series with each other through the circuit pattern 4. The surface pattern 41 of the circuit pattern 4 includes two external connections 41a that are disposed at the diagonal corners (in FIG. 2, top right and bottom left corners) of the mounting substrate 3 and connected to the external terminals 44, so that the nine LED elements 2 can be driven by applying a voltage to the external terminals 44.

A method of making the light emitting device 1 will be explained below referring to FIG. 3. FIG. 3 is a cross sectional view showing an intermediate product before it is separated into plural light emitting devices by a dicer.

In making the light emitting device 1, a plate glass 9 is provided which has a thickness corresponding to the vertical length t1 and has the phosphor 5 for converting blue light into yellow light dispersed therein at concentration of 'a'. Although the production process of the plate glass 9 can be optional, the plate glass 9 can be made, for example, such that glass powder is mixed with the phosphor 5, the mixed powder is melted by applying a load thereto and then solidified, and the solidified glass is sliced.

On the other hand, separately from the glass plate 9, the mounting substrate 3 with the via hole is provided. W paste is screen-printed on the surface of the mounting substrate 3 in accordance with the circuit pattern 4. As shown in FIG. 3, at this stage, many via holes are formed in the mounting substrate 3 according to the plural light emitting device 1. Then, W is thermally bonded to the mounting substrate 3 by heating the mounting substrate 3 with the W paste printed thereon. Further, Ni plating and Au plating are sequentially conducted on the W so as to form the circuit pattern 4. Then, the plural LED elements 2 are electrically connected through the Au bump to the surface pattern 41 of the circuit pattern 4 on the mounting substrate 3.

Then, the mounting substrate 3 with the LED elements 2 mounted thereon is placed on a lower mold 91 and the plate glass 9 is placed on an upper mold 92. Then, as shown in FIG. 3, while the plate glass 9 is stacked on the substantially flat mounting surface 3a of the mounting substrate 3, the lower mold 91 and the upper mold 92 are pressed against each other in nitrogen atmosphere by hot pressing. Thereby, the plate glass 9 is fusion-bonded to the mounting substrate 3 with the LED elements 2 mounted thereon, so that the LED elements 2 on the mounting substrate 3 can be sealed with the plate glass 9. In such a case, the plate glass 9 and the mounting substrate 3 are bonded together through oxides included therein.

Thus, as shown in FIG. 3, the intermediate product 10 is prepared where the plural light emitting devices 1 are not separated yet. Then, the mounting substrate 3 with the sealing part 6 united therewith is set in the dicer, which allows it to be divided into the separate light emitting device 1 composed of the LED elements 2. The sealing part 6 and the mounting substrate 3 are cut concurrently by the dicer, so that they can have a plane in common. Then, the inorganic paste with the phosphor 5 included therein is coated on the top surface 6b of the sealing part 6 to form the transparent member 7.

In operation for the light emitting device 1, when voltage is applied through the circuit pattern 4 to the LED elements 2, blue light is emitted radially from the LED elements 2. A part of blue light emitted is converted into yellow light by the phosphor 5 in the sealing part 6, and the other part is emitted through the sealing part 6 without being wavelength-converted. Thereby, light radiated from the sealing part 6 exhibits white light that has peak wavelengths in yellow and blue regions.

Here, the LED elements 2 are not formed into a large size chip with 9 elements integrated and disposed away from each other. Therefore, thermal influence does not seriously arise between the LED elements 2. Further, since the LED elements 2 are each disposed at intervals broader than the mounting substrate 3, most of heat generated from the LED elements 2 can be externally radiated through the heat dissipation pattern 45 so as to reduced the thermal influence between the LED elements 2. However, the light emitting device 1 must be wider in total planar size than that provided with one large-size LED element.

Since in the sealing part 6 the lateral length L is made longer than the vertical length t1, light laterally emitted from the LED elements 2 has a longer light-propagating distance than light vertically emitted therefrom. As a result, light incident on the side face 6a of the sealing part 6 is higher in wavelength-converted ratio by the phosphor 5 than light incident on the top surface 6b of the sealing part 6.

The light incident on the side face 6a of the sealing part 6 is externally discharged therethrough, and the light incident on the top surface 6b of the sealing part 6 further enters in the transparent member 7. The light entering in the transparent member 7 is partly wavelength-converted by the phosphor 5 and then externally discharged. Thus, the difference in wavelength-converted ratio can be reduced between the light discharged from the side face 6a of the sealing part 6 and the light discharged from the transparent member 7.

The vertical dimension t2 of the transparent member 7 is made smaller than the difference between the lateral length L and the vertical length t1 of the sealing part 6. Therefore, even if the transparent member 7 has the same phosphor 5 concentration as the sealing part 6, the difference in chromaticity will be still yielded. However, since the transparent member 7 has the phosphor 5 concentration higher than the sealing part 6, the difference in chromaticity can be reduced between light discharged from the side faces 6a of the sealing part 6 and light discharged from the transparent member 7. Further, since the vertical dimension of the transparent member 7 is smaller than the difference between the lateral length L and the vertical length t1 of the sealing part 6, the device can be downsized as well as the reduced difference in chromaticity.

The light emitting device 1 of this embodiment is formed such that the top surface 6b and the bottom surface 6c of the sealing part 6 are both formed square and the lateral lengths L are equal on both sides. Therefore, all lights discharged through the side faces 6a of the sealing part 6 can be substantially equalized in chromaticity.

The wavelength-converted ratio in a material containing the phosphor is determined by multiplying the light-propagating distance by the phosphor concentration. In the light emitting device 1, provided that lights are radially radiated from the center 'O', the wavelength-converted rate, (L×a), for light externally discharged perpendicularly through the side faces 6a of the sealing part 6 is nearly equal to the wavelength-converted rate, (t1×a+t2×b), for light externally discharged through the transparent member 7. Thus, the difference in chromaticity can be almost eliminated between light discharged from the side faces 6a of the sealing part 6 and light discharged from the transparent member 7.

With regard to light obliquely upward emitted from the LED element 2 at an angle of 45 degrees to the mounting surface 3a, the optical path in the sealing part 6 becomes $\sqrt{2}$ times the lateral length L. Therefore, in this case, if the relationship:

$$(L \times a) \leq (t1 \times a + t2 \times b) \leq (L \times a) \times \sqrt{2}$$

is satisfied, the difference in chromaticity can be effectively reduced between lights discharged externally. Even if the above relationship is not satisfied, it is needless to say that, by disposing the transparent member 7 with a higher phosphor 5 concentration than the sealing part 6 on the sealing part 6, the difference in chromaticity can be eliminated.

In the light emitting device 1, the lateral length L tends to be longer than the vertical length t1 since there are plural LED elements 2 mounted on the mounting surface of the mounting substrate 3 and the sealing part 6 is formed along the entire mounting surface 3a to seal all the LED elements 2. Thus, the difference in chromaticity is easy to yield between lights discharged externally. However, as described above, even in the composition easy to yield the difference in chromaticity, the difference in chromaticity can be almost eliminated between light discharged from the side faces 6a of the sealing part 6 and light discharged from the transparent member 7. Therefore, the amount of light can be increased by providing for the plural LED elements 2 while reducing unevenness in emission color of light discharged externally, and the vertical dimension to the mounting substrate 3 of the device can be downsized. Thus, the light emitting device 1 of this embodiment can be advantageous in practical use.

Further, the transparent member 7 is formed as inorganic paste independently from the sealing part 6. Thus, as compared to the case that the vertical length t1 of the sealing part 6 is increased to reduce the unevenness in emission color, the contact time or area between the dicer blade and the glass (=sealing part 6) during the dicing process can be reduced. Therefore, the wear volume of the dicer blade can be reduced so that the exchange cycle for the blade can be elongated and the mass productivity can be enhanced.

Second Embodiment

Figure 4:
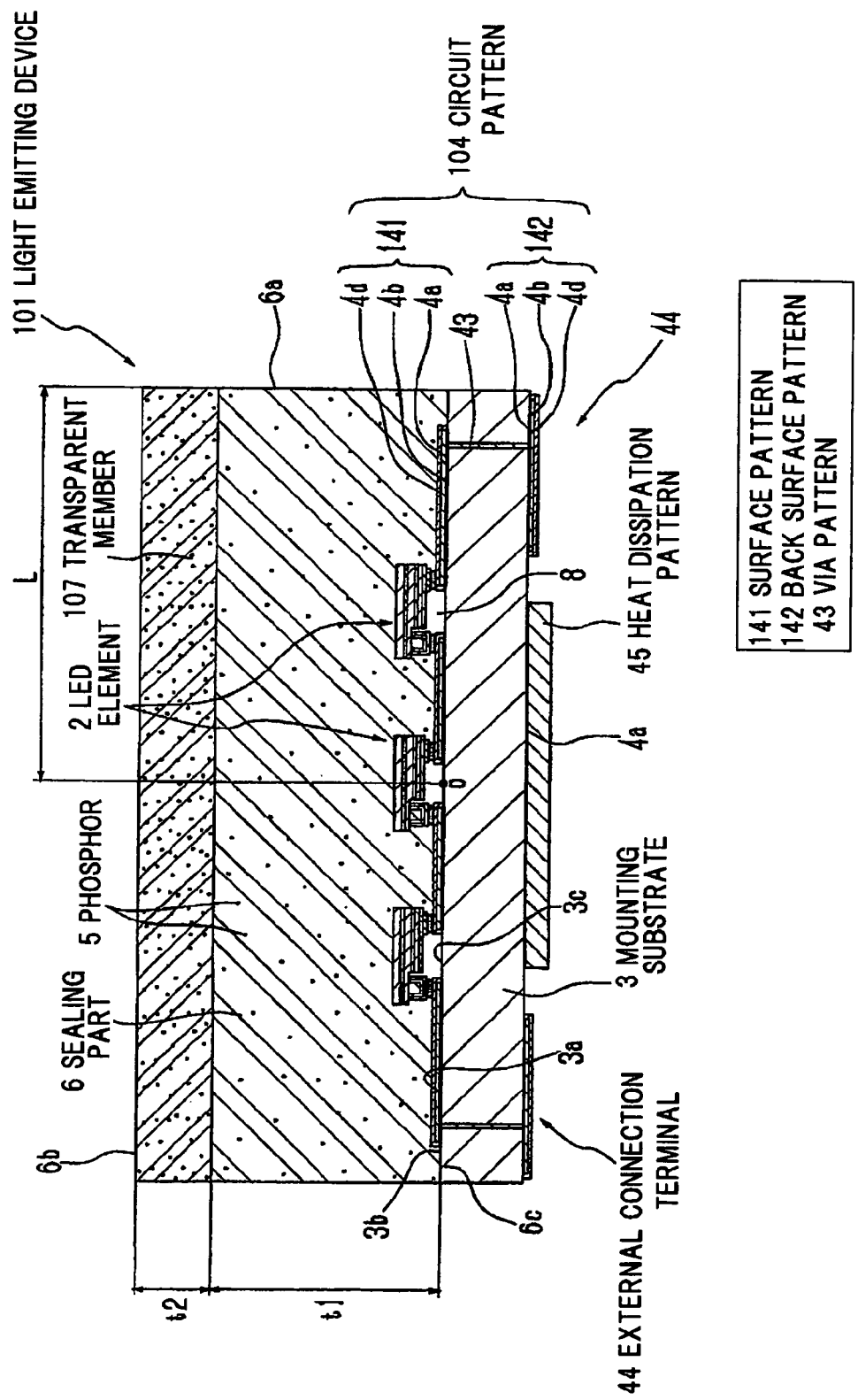
FIG. 4 is a cross sectional view showing a light emitting device in a second preferred embodiment according to the invention.
Figure 5:
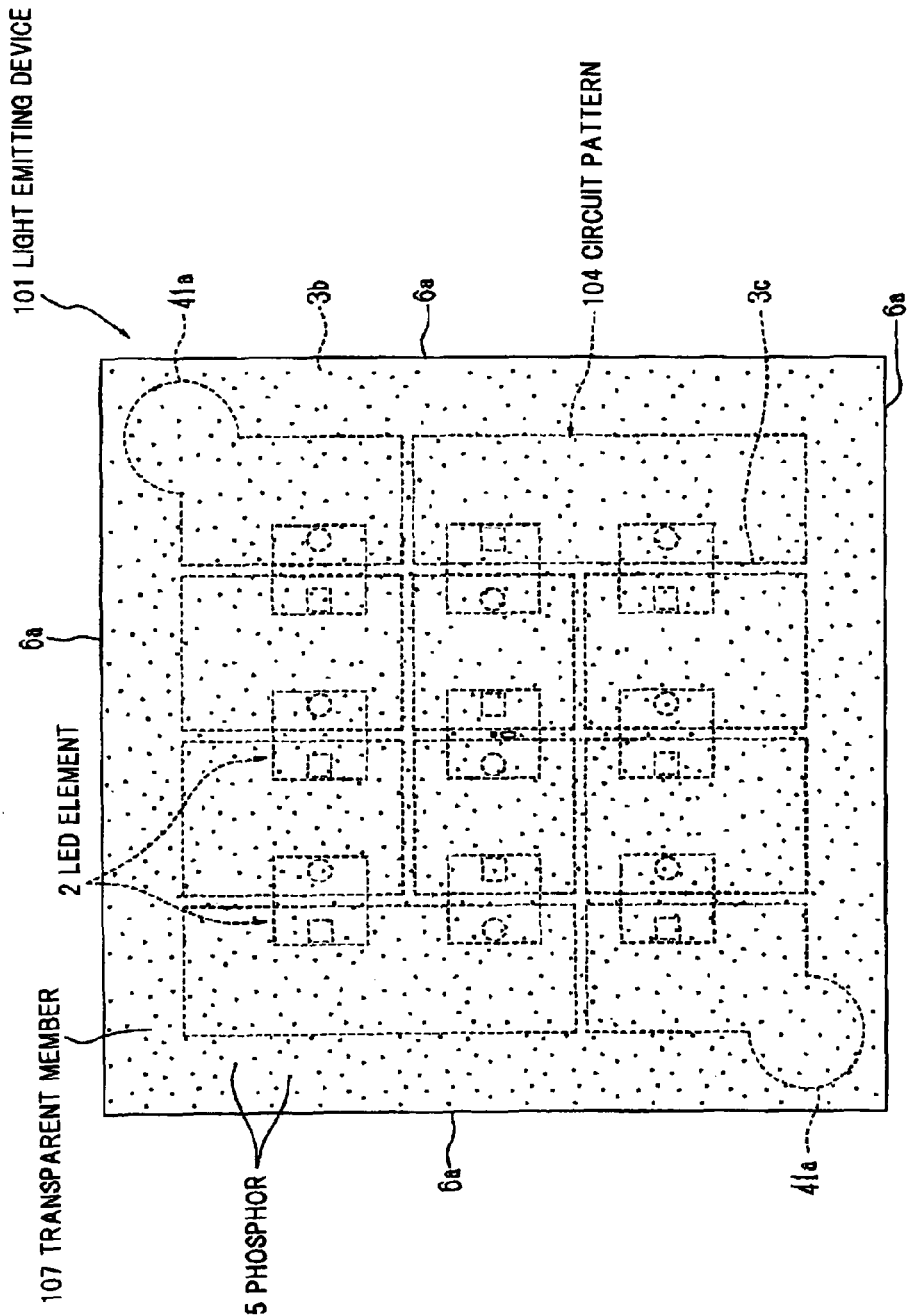
FIG. 5 is a top view showing the light emitting device in FIG. 4.

FIGS. 4 and 5 illustrate a second preferred embodiment according to the invention. FIG. 4 is a cross sectional view showing a light emitting device in the embodiment, and FIG. 5 is a top view showing the light emitting device in FIG. 4. Hereinafter, like components will be indicated by the same numerals as used above and explanations thereof will be omitted. The second embodiment is difference from the first embodiment in relation to the transparent member and the circuit pattern on the mounting substrate.

As shown in FIG. 4, the light emitting device 101 comprises the plural LED elements 2, the mounting substrate 3 for mounting the LED elements 2 thereon, the circuit pattern 104 formed on the mounting substrate 3 and formed of tungsten (W)-nickel (Ni)-silver (Ag), the sealing part 6 for sealing the LED elements 2 on the mounting surface 3a of the mounting substrate 3 and formed of glass with phosphor 5 dispersed therein, and a transparent member 107 formed on the sealing part 6 and having the phosphor 5 dispersed therein.

A surface pattern 141 of the circuit pattern 4 comprises a W layer 4a patterned according to the shape of the electrode of the LED elements 2, a thin-film Ni layer 4b covering the surface of the W layer 4a, and a thin-film Ag layer 4d covering the surface of the Ni layer 4b. A back surface pattern 142 of the circuit pattern 4 comprises a W layer 4a patterned according to the shape of an external terminal 44, a thin-film Ni layer 4b covering the surface of the W layer 4a, and a thin-film Ag layer 4d covering the surface of the Ni layer 4b. As shown in FIG. 5, the mounting surface 3a of the mounting substrate 3 is mostly covered by the circuit pattern 104 with the Ag layer 4d as the surface layer. For example, it is covered by the circuit pattern 104 except en edge portion 3b of the mounting surface 3a and an insulating portion 3c for the circuit pattern 104 on the mounting surface 3a. In this embodiment, about 90% of the mounting surface 3a is covered by the circuit pattern 104. If the LED elements 2 are closely mounted considering the mounting decision thereof and the via pattern 43 is disposed around the LED elements 2, the size of the mounting surface 3a becomes about the same as that in this embodiment. Here, if the circuit pattern 104 is provided according to the position of the LED elements 2 and with a width twice the LED element 2, the mounting surface 3a of the mounting substrate 3 can be covered by the Ag in 40% of area thereof. If the mounting surface 3a of the mounting substrate 3 is covered by the Ag in 40% of area thereof, light emitted from the LED elements 2 can be so efficiently reflected.

As shown in FIG. 4, the transparent member 107 is formed on the top surface 6b of the sealing part 6 and contains the same phosphor 5 as that dispersed in the sealing part 6. The transparent member 107 is made of SiO—B$_2$O$_3$-based heat melting glass, and shaped like a rectangular solid on the sealing part 6. The transparent member 107 has glass transition temperature (Tg) higher than the sealing part 6 and mold-releasing property better than the sealing part 6. For example, the glass transition temperature (Tg) of the transparent member 107 is 560° C. and superior in humidity resistance, acid resistance and alkali resistance to the sealing part 6. In general, glasses with high thermal characteristic values such as glass transition temperature (Tg) can be frequently superior in humidity resistance, acid resistance and alkali resistance. The transparent member 107 is 1.5 in refractive index. The transparent member 107 may be formed of, other than SiO—B$_2$O$_3$-based, SiO—B$_2$O$_3$—Al$_2$O$_3$-based, SiO—Al$_2$O$_3$-based and SiO—R$_2$O-based (R is Li, Na, K etc.) etc.

The transparent member 107 is formed 0.25 mm in vertical dimension t2. The sealing part 6 is 1.35 mm in lateral length L and 0.75 mm in vertical length t1, where the difference therebetween is 0.6 mm. Thus, the vertical dimension t2 of the transparent member 107 is made smaller than this difference.

The transparent member 107 has the phosphor 5 dispersed therein at concentration higher than the sealing part 6. In this embodiment, the concentration b of the phosphor 5 in the transparent member 107 is 6.24% by volume.

Thus, the light emitting device 101 of this embodiment satisfies the relationship:

$L \times a = t1 \times a + t2 \times b$ where L is the lateral length of the sealing part 6, t1 is the vertical length of the sealing part 6, a is the concentration by unit volume of the phosphor 5 in the sealing part 6, t2 is the vertical dimension of the transparent member 107 and b is the concentration by unit volume of the phosphor 5 in the transparent member 107.

In producing the light emitting device 101, a plate glass for forming the transparent member 107 is stacked on the plate glass 9 (See FIG. 3) for forming the sealing part 6, and they are hot-pressed on the mounting substrate 3. Here, the plate glass 9 for the sealing part 6 does not contact the upper mold and the plate glass for the transparent member 7 with the better mold-releasing property contacts the upper mold.

Also by the light emitting device 101 of this embodiment, the difference in chromaticity can be almost eliminated between light emitted from the side faces 6a of the sealing part 6 and light emitted from the transparent member 107, and the device size can be downsized. Further, since the transparent member 107 is made of glass, it can be processed together with the sealing part 6.

Since the transparent member 107 with the better humid, acid and alkali resistances than the sealing part 6 is formed on the sealing part 6 which has a relatively much amount in externally radiated light from the LED element 2, the deterioration of the transparent member 107 on the sealing part 6 can be effectively prevented. Therefore, the temporal change in light extraction efficiency of the light emitting device 101 can be prevented.

Since the surface of the circuit pattern 104 on the mounting substrate 3 is plated by Ag with high reflectivity, light to be diffused by the phosphor 5 so as to be absorbed in the mounting substrate 3 or the circuit pattern 104 can be thereby reduced to increase the light extraction efficiency. In this embodiment, since the Ag plating occupies more than 40% of the bottom surface 6c of the sealing part 6, the light extraction efficiency can be increased advantageously. Further, since the Ag plating is sealed by the alumina and glass with no moisture permeability, it can be prevented from the blackening of Ag caused by oxidation when sealed by a moisture permeable resin, and the migration of Ag caused by humidity, voltage etc.

Figure 6:
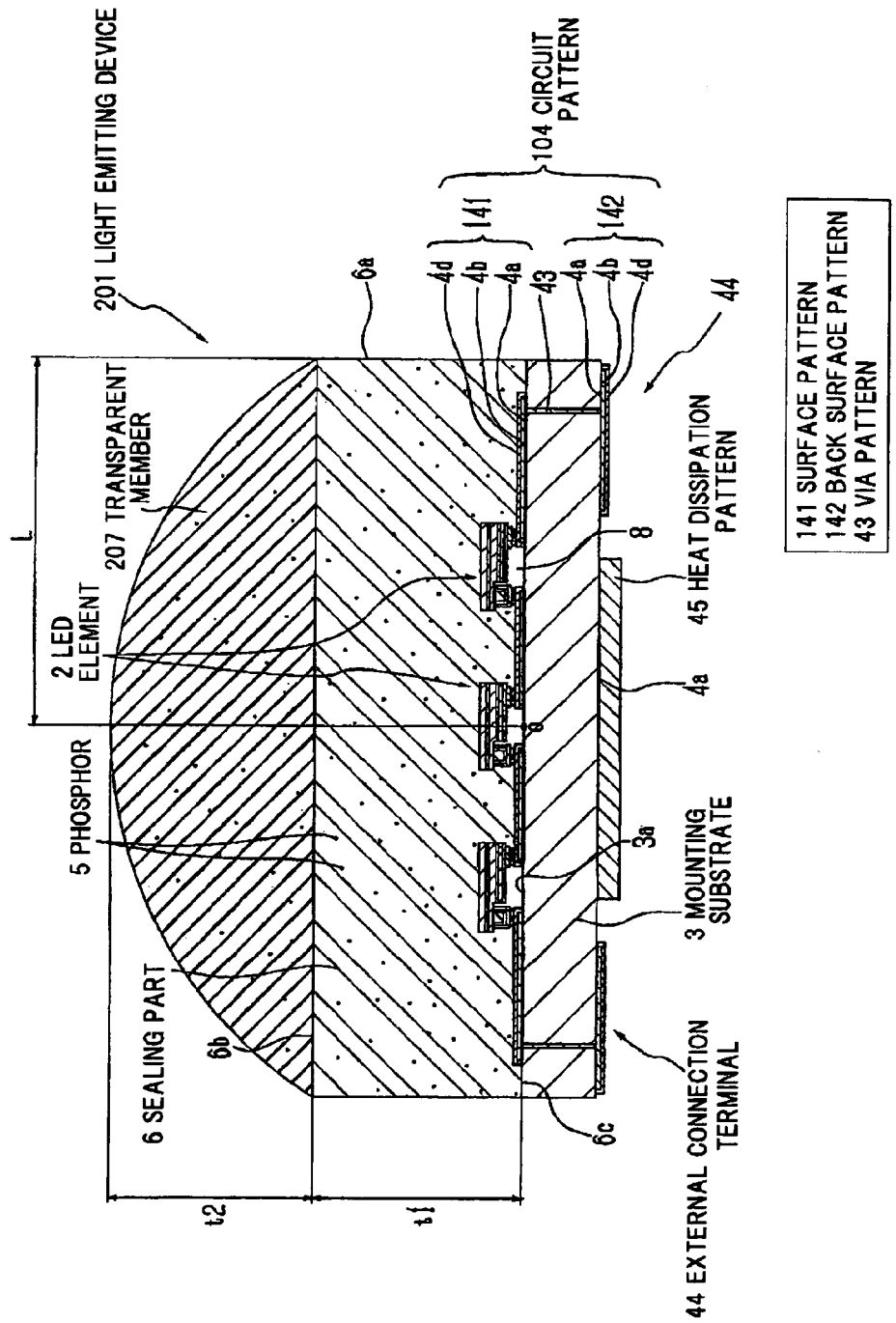
FIG. 6 is a cross sectional view showing a light emitting device in modification of the second embodiment according to the invention.

FIG. 6 is a cross sectional view showing a light emitting device in modification of the second embodiment according to the invention.

As shown in FIG. 6, the light emitting device 201 is different from the second embodiment in relation to the material and shape of a transparent member 207 thereof. Hereinafter, like components will be indicated by the same numerals as used above and explanations thereof will be omitted.

The transparent member 207 is formed of resin with the phosphor 5 included therein, and provided with a curved top surface thereof. For example, the transparent member 207 is made of acrylic and silicone resins etc. The transparent member 207 protrudes with an uppermost part just over the center O of the mounting substrate 3 where the vertical dimension t2 is 0.75 mm. The transparent member 207 has the phosphor 5 dispersed therein at a concentration higher than the sealing part 6. For example, the concentration of the phosphor 5 in the transparent member 207 is 3.0% by volume.

Thus, the light emitting device 201 in modification of the second embodiment satisfies the relationship:

$L \times a = t1 \times a + t2 \times b$ where L is the lateral length of the sealing part 6, t1 is the vertical length of the sealing part 6, a is the concentration by unit volume of the phosphor 5 in the sealing part 6, t2 is the vertical dimension of the transparent member 207 and b is the concentration by unit volume of the phosphor 5 in the transparent member 207.

Also by the light emitting device 201, the difference in chromaticity can be almost eliminated between light emitted from the side faces 6a of the sealing part 6 and light emitted from the transparent member 207. Further, since the upper surface of the transparent member 207 is shaped like a curve protruding with the uppermost part just over the center O, the difference in chromaticity can be further reduced.

Third Embodiment

Figure 7:
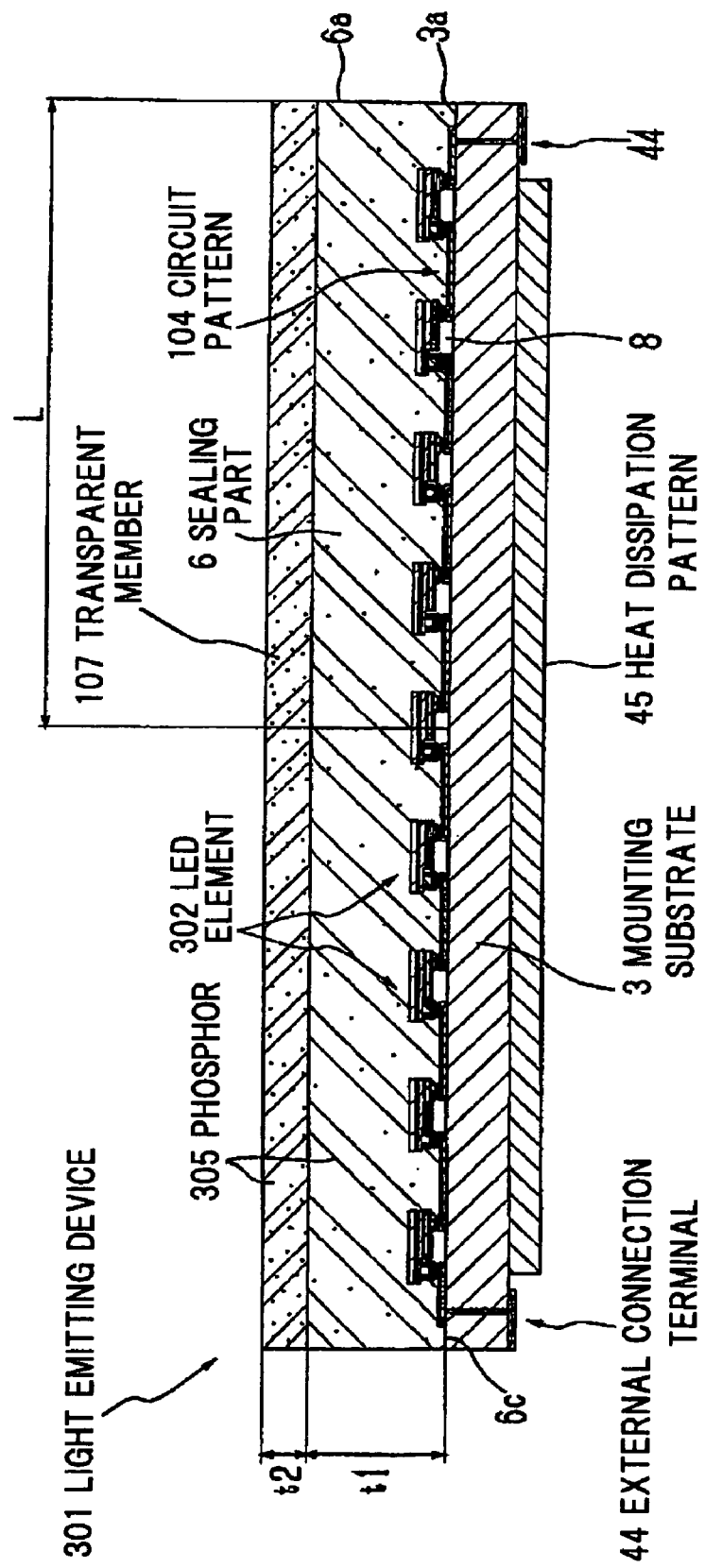
FIG. 7 is a cross sectional view showing a light emitting device in a third preferred embodiment according to the invention.

FIG. 7 is a cross sectional view showing a light emitting device in the third preferred embodiment according to the invention. Hereinafter, like components will be indicated by the same numerals as used above and explanations thereof will be omitted. The third embodiment is difference from the second embodiment in relation to the emission wavelength and number of LED elements, the kind of phosphor, and the dimensions of the mounting substrate, the sealing part and the transparent member.

As shown in FIG. 7, the light emitting device 301 comprises the plural LED elements 302, the mounting substrate 3 for mounting the LED elements 302 thereon, the circuit pattern 104 formed on the mounting substrate 3 and formed of tungsten (W)-nickel (Ni)-silver (Ag), the sealing part 6 for sealing the LED elements 302 on the mounting surface 3a of the mounting substrate 3 and formed of glass with phosphor 305 dispersed therein, and the transparent member 107 formed on the sealing part 6 and having the phosphor 305 dispersed therein.

In this embodiment, the LED element 302 is 380 nm in emission peak wavelength. The phosphor 305 is composed of some phosphors for converting ultraviolet light emitted from the LED element 302 into blue, green and red light. As a result, the light emitting device 301 can yield white light with peak wavelengths in blue, green and red emission regions.

The mounting substrate 3 is made of alumina polycrystal sintered material, 0.25 mm in thickness, shaped like a square with a side of 7.0 mm, and $7 \times 10^{-6}/°$ C. in thermal expansion coefficient ($\alpha$). The circuit pattern 104 on the mounting substrate 3 is the same as the second embodiment and its explanation is omitted. The heat dissipation pattern 45 is about the same as the first embodiment except being increased in size.

The sealing part 6 is formed of $ZnO-B_2O_3-SiO_2-Nb_2O_5-Na_2O-Li_2O$-based heat melting glass, and has the top surface 6b and the bottom surface 6c shaped like a square with a side of 7.0 mm like the mounting substrate 3. In this embodiment, the sealing part 6 is 3.5 mm in lateral length L and 0.75 mm in vertical length. The concentration 'a' of the phosphor 305 is 1.0% by volume.

The transparent member 107 is made of $SiO-B_2O_3$-based heat melting glass, and shaped like a square with a side of 7.0 mm in top view thereof. The transparent member 107 is formed 0.25 mm in vertical dimension t2. The sealing part 6 is 3.5 mm in lateral length L and 0.75 mm in vertical length t1, where the difference therebetween is 2.75 mm. Thus, the vertical dimension t2 of the transparent member 107 is made smaller than this difference. The transparent member 107 has the phosphor 305 dispersed therein at concentration higher than the sealing part 6. In this embodiment, the concentration 'b' of the phosphor 305 in the transparent member 107 is 11% by volume. Meanwhile, the concentration 'b' of the phosphor 305 can be 11% by weight since the specific gravity of the glass is about the same as that of the phosphor.

Thus, the light emitting device 301 of this embodiment satisfies the relationship:

$$L \times a = t1 \times a + t2 \times b$$

where L is the lateral length of the sealing part 6, t1 is the vertical length of the sealing part 6, a is the concentration by unit volume of the phosphor 305 in the sealing part 6, t2 is the vertical dimension of the transparent member 107 and b is the concentration by unit volume of the phosphor 305 in the transparent member 107.

The LED elements 302 are arrayed 9×9 in the lengthwise and crosswise directions, such that the eighty-one LED elements 302 are in total mounted on one mounting substrate 3. Of the LED elements 302, the LED element 302 at the center of the lengthwise and crosswise array is located at the center O of the lower surface 6c of the sealing part 6. The other LED elements 302 are disposed symmetrically to the center O in the lengthwise, crosswise and diagonal directions. Thereby, when the LED elements 302 are driven, lights entering into the four side faces 6a of the sealing part 6 can be equalized. In this embodiment, the interval of the neighboring LED elements 302 in the lengthwise and crosswise directions is set 600 μm.

By the light emitting device 301 of this embodiment, the difference in chromaticity between light emitted from the side faces 6a of the sealing part 6 and light emitted from transparent member 107 can be almost eliminated. Thus, light emitting device 302 can have as a whole high emission efficiency while preventing the difference in emission efficiency among the directions of light emitted from the LED elements 302. Of the directions of light emitted from the LED elements 302, a direction where the product is too small which is obtained by multiplying the concentration of the phosphor 305 by the light-propagating distance in the sealing part 6 will allow the ultraviolet light emitted from the LED element 302 to be externally radiated without being sufficiently wavelength-converted into a visible light. In contrast, of the directions of light emitted from the LED elements 302, a direction where the product is too large which is obtained by multiplying the concentration of the phosphor 305 by the light-propagating distance in the sealing part 6 will prevent the external radiation of a visible light converted from the ultraviolet light. This embodiment can solve the problem so as to have high emission efficiency since the product of the concentration of the phosphor 305 and the light-propagating distance in the sealing part 6 can be kept in appropriate range regardless of the directions of light emitted from the LED element 302.

The light emitting device 301 of this embodiment can be downsized. Further, the transparent member 107 can be processed together with the sealing part 6 since it is made of glass.

Since the transparent member 107 with the better humid, acid and alkali resistances than the sealing part 6 is formed on the sealing part 6 which has a relatively much amount in externally radiated light from the LED element 302, the deterioration of the transparent member 107 on the sealing part 6 can be effectively prevented. Therefore, the temporal change in light extraction efficiency of the light emitting device 301 can be prevented.

Further, the light emitting device 301 can provide for a white light source with high color rendering properties, where light with a peak wavelength of 380 nm is converted into blue, green and red lights. As in the second embodiment, the Ag plating on the circuit pattern 104 can yield high light extraction efficiency. Here, although the reflectivity of Ag lowers less than 90% to light with a wavelength less than 370 nm, ultraviolet light emitted from the LED element 302 can be efficiently used since the LED element 302 emits light with a wavelength of 370 nm to 410 nm. Thus, the light with a wavelength of 370 nm to 410 nm emitted from the LED element 302 can be wavelength-converted into a visible light by the phosphor 305. Since standard relative luminous efficiency is more than 0.001 at 410 nm or more, the emission spectrum of the light emitting device 301 can be stabilized while having mainly the emission of the phosphor 305.

Fourth Embodiment

Figure 8:
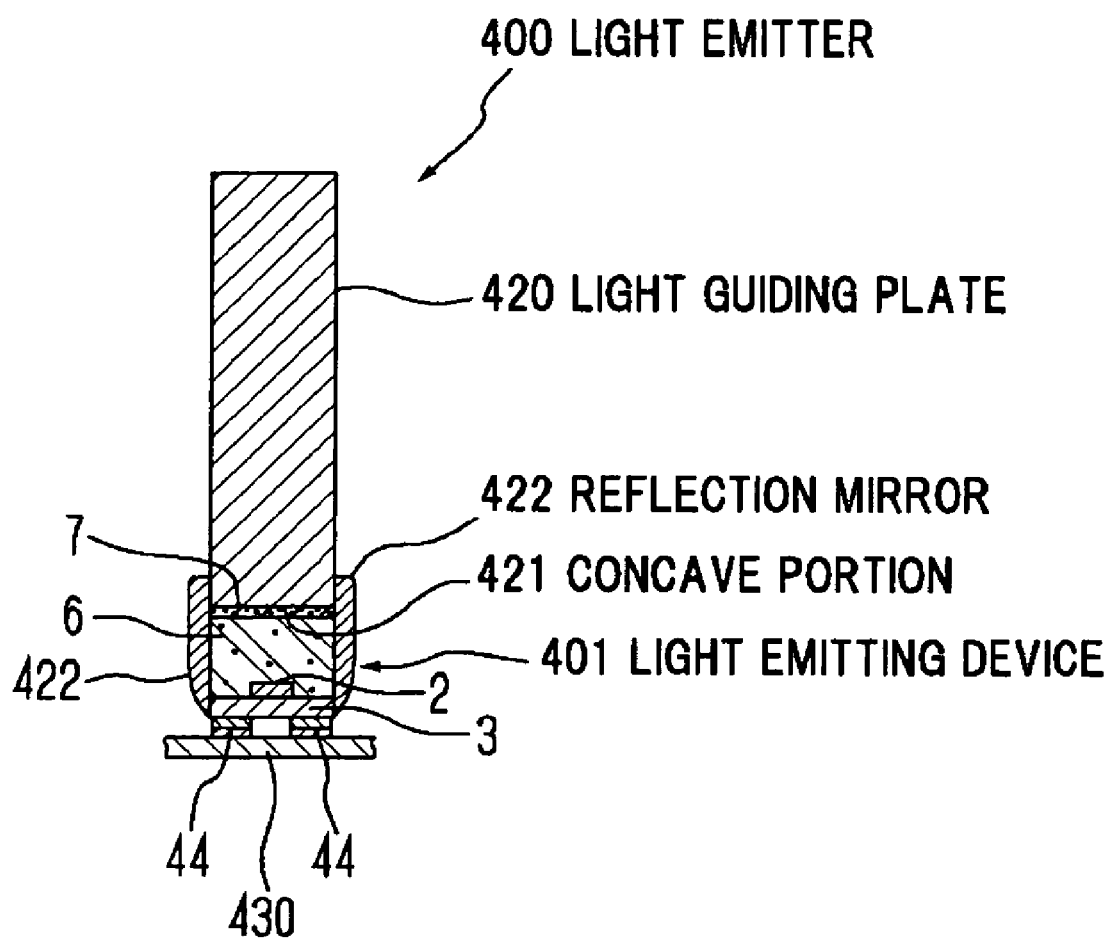
FIG. 8 is a cross sectional view showing a light emitter in a fourth preferred embodiment according to the invention.
Figure 9:
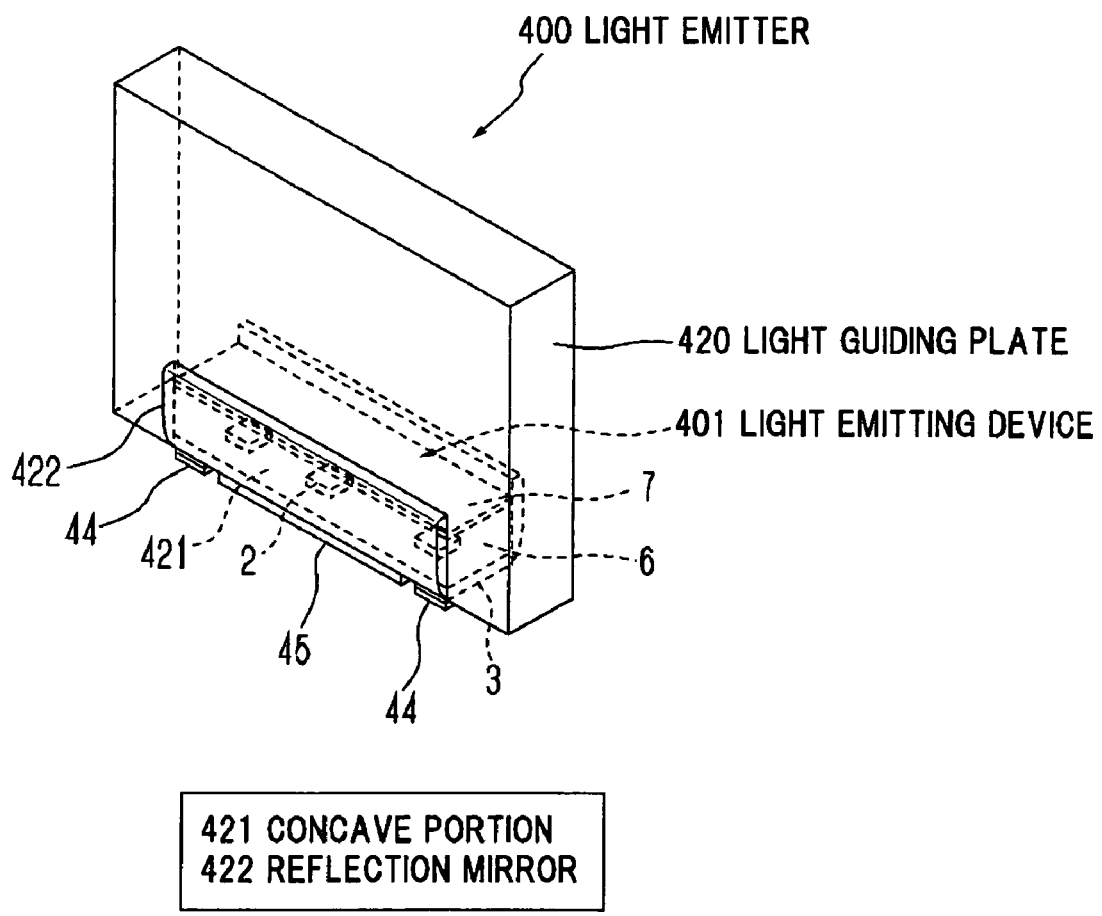
FIG. 9 is a perspective view showing the light emitter in FIG. 8.

FIGS. 8 and 9 illustrate the fourth preferred embodiment according to the invention. FIG. 8 is a cross sectional view showing a light emitter in the fourth embodiment. FIG. 9 is a perspective view showing the light emitter in FIG. 8.

As shown in FIG. 8, the light emitter 400 comprises a light emitting device 401, a light guiding plate 420 for guiding light emitted from the light emitting device 401, and a power supplying substrate 430 for supplying power to the light emitting device 401. The light emitting device 401 is formed as a whole elongate and composed of the plural LED elements 2, the mounting substrate 3 for mounting the LED elements 2 thereon, the circuit pattern (no shown) formed on the mounting substrate 3 and formed of tungsten (W)-nickel (Ni)-gold (Au), the sealing part 6 for sealing the LED elements 2 on the mounting surface 3a of the mounting substrate 3 and formed of glass with the phosphor 5 dispersed therein, and the transparent member 7 formed on the sealing part 6 and having the phosphor 5 dispersed therein.

The mounting substrate 3 is formed of alumina ($Al_2O_3$) polycrystalline sintered material, as shown FIG. 9, formed 0.25 mm in thickness, shaped like a rectangle with a long side of 7.0 mm and a short side of 1.0 mm, and $7 \times 10^{-6}$/C in thermal expansion coefficient ($\alpha$). The circuit pattern 4 on the mounting substrate 3 is the same as that in the first embodiment and its explanation thereof is omitted. Further, the heat dissipation pattern 45 is about the same as the first embodiment except being increased in size.

The sealing part 6 is formed of $ZnO$-$B_2O_3$-$SiO_2$-$Nb_2O_3$-$Na_2O$-$Li_2O$-based heat melting glass, and has the top surface 6b and the bottom surface 6c shaped like a rectangle with a long side of 7.0 mm and a short side of 1.0 mm like the mounting substrate 3. In this embodiment, the sealing part 6 is 3.5 mm in longer one of two lateral lengths L and 0.75 mm in vertical length. The concentration 'a' of the phosphor 5 is 1.0% by volume.

The transparent member 7 is made of inorganic paste of $SiO_2$ etc., and shaped like a rectangle with a long side of 7.0 mm and a short side of 1.0 mm in top view thereof. The transparent member 7 is formed 0.1 mm in vertical dimension t2. The sealing part 6 is 3.5 mm in the longer lateral length L and 0.75 mm in vertical length t1, where the difference therebetween is 2.75 mm. Thus, the vertical dimension t2 of the transparent member 7 is made smaller than this difference. The transparent member 7 has the phosphor 5 dispersed therein at concentration higher than the sealing part 6. In this embodiment, the concentration 'b' of the phosphor 5 in the transparent member 7 is 27.5% by volume.

Thus, the light emitting device 401 of this embodiment satisfies the relationship:

$$L \times a = t1 \times a + t2 \times b$$

where L is the longer lateral length of the sealing part 6, t1 is the vertical length of the sealing part 6, a is the concentration by unit volume of the phosphor 5 in the sealing part 6, t2 is the vertical dimension of the transparent member 7 and b is the concentration by unit volume of the phosphor 5 in the transparent member 7.

The LED elements 2 of the light emitting device 401 are arrayed three in the longitudinal direction of the mounting substrate 3. Of the LED elements 2, the LED element 2 at the center is located at the center O of the lower surface 6c of the sealing part 6. The other LED elements 302 are disposed symmetrically to the center O in the longitudinal direction of the mounting substrate 3. In this embodiment, the interval of the neighboring LED elements 2 in the longitudinal direction is set 600 μm.

The light guiding plate 420 is made of, e.g., an acrylic plate, and surface-emits light to be introduced through an end face thereof. In other words, the main surface of the light guiding plate 420 functions as an irradiated surface on which light emitted from the light emitting device 401 is irradiated. Also, the main surface of the light guiding plate 420 functions as an emission surface through which light emitted from the light emitting device 401 is discharged. In this embodiment, the light guiding plate 420 is 1.0 mm in thickness and has a concave portion 421 on one end face thereof for housing the light emitting device 401. The light emitting device 401 allows the transparent member 7 to contact the end face of the light guiding plate 420, and is disposed such that the longitudinal direction thereof agrees with the direction where the light guiding plate 420 extends. The light guiding plate 420 is provided with a reflection mirror 422 as a reflection member for covering the light emitting device 401 housed in the concave portion 421 at both side faces along the longitudinal direction of the light emitting device 401. In other words, the reflection mirror 422 is disposed outside the side faces 6a along the longitudinal direction of the light emitting device 401 for covering the side faces 6a. Thereby, light discharged through the side face 6a to the reflection mirror 422 can be reflected back through the side face 6a to the light emitting device 401. The reflection mirror 422 is made of, e.g., aluminum (Al).

The power supplying substrate 430 is electrically connected to an external connection terminal 44 of the light emitting device 401. Here, the heat dissipation pattern 45 and the external connection terminal 44 of the light emitting device 401 protrude from the bottom end of the concave portion 421 so as to prevent the light guiding plate 420 from directly contacting the power supplying substrate 430.

By the light emitting device 401 of this embodiment, the difference in chromaticity between light emitted from the side faces 6a with the longer lateral length L of the sealing part 6 and light emitted from transparent member 7 can be almost eliminated. Here, since the side faces 6a with the shorter lateral length L are covered by the reflection mirror 422, light insufficient in wavelength conversion is not discharged through the side faces 6a with the shorter lateral length L into the light guiding plate 420.

Thus, the light guiding plate 420 can surface-emit light that is emitted from the light emitting device 401 while almost eliminating the difference in chromaticity. Further, the light emitting device 401 is formed elongated so as not to protrude in the thickness direction of the light guiding plate 420. Thereby, the device can be formed compactly.

The light emitter 400 allows light from the light emitting device 401 to be imaged on the irradiated surface. Where there is provided the irradiated surface, a viewer can sensitively sense unevenness in chromaticity since the difference in chromaticity of light emitted from the light emitting device 401 is also imaged thereon. However, since the light emitting device 401 of the light emitter 400 has the reduced difference in chromaticity as described above, light with the reduced difference in chromaticity can be imaged on the irradiated surface so that the viewer can sense the image with uniform chromaticity.

Although in the fourth embodiment light emitted from the light emitting device 401 is guided by the light guiding plate 420, the light may be guided by using a reflection mirror etc. to the irradiated surface.

Fifth Embodiment

Figure 10:
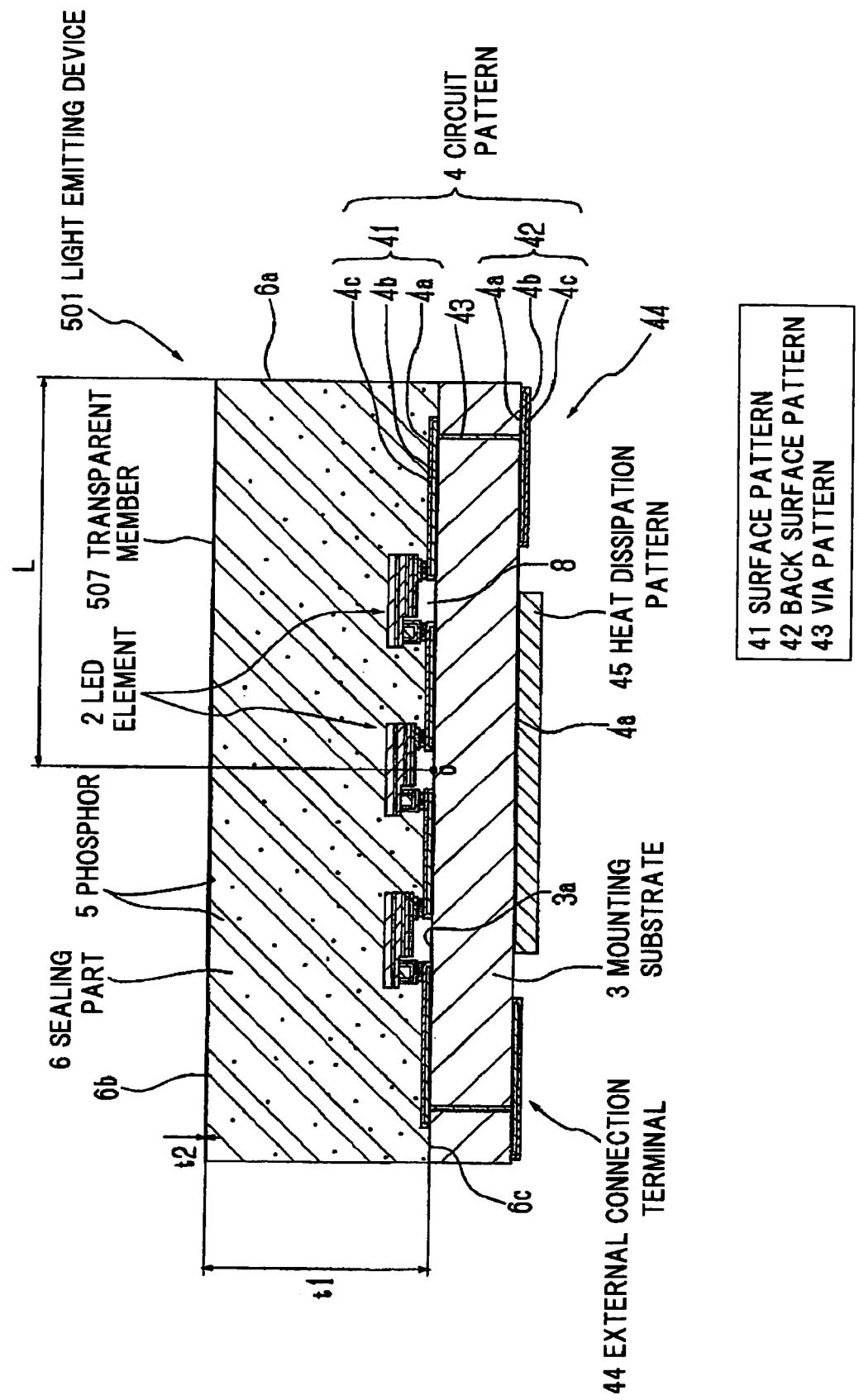
FIG. 10 is a cross sectional view showing a light emitting device in a fifth preferred embodiment according to the invention.

FIGS. 10 to 13 illustrate the fifth preferred embodiment according to the invention. FIG. 10 is a cross sectional view showing a light emitting device in the fifth embodiment. Hereinafter, like components will be indicated by the same numerals as used above and explanations thereof will be omitted. The fifth embodiment is difference from the first embodiment in relation to the transparent member.

As shown in FIG. 10, the light emitting device 501 has a relatively thin transparent member 507 formed on the top surface 6b of the sealing part 6. The transparent member 507 is 15 to 30 μm in thickness which is a little thicker than the average diameter of the phosphor 5. The lateral length L of the sealing part 6 is 1.35 mm and the vertical length t1 is 0.75 mm, where the difference therebetween is 0.6 mm. Thus, the vertical dimension t2 of the transparent member 507 is made smaller than this difference. The transparent member 507 is made of inorganic paste and has a concentration 'b' of the phosphor 5 of 50 to 80% by weight. The concentration 'a' of the phosphor 5 in the sealing part 6 is 2.4% by weight. Meanwhile, the concentration 'a' of the phosphor 5 in the sealing part 6 can be 2.4% by volume since the specific gravity of the glass is about the same as that of the phosphor.

Figure 11:
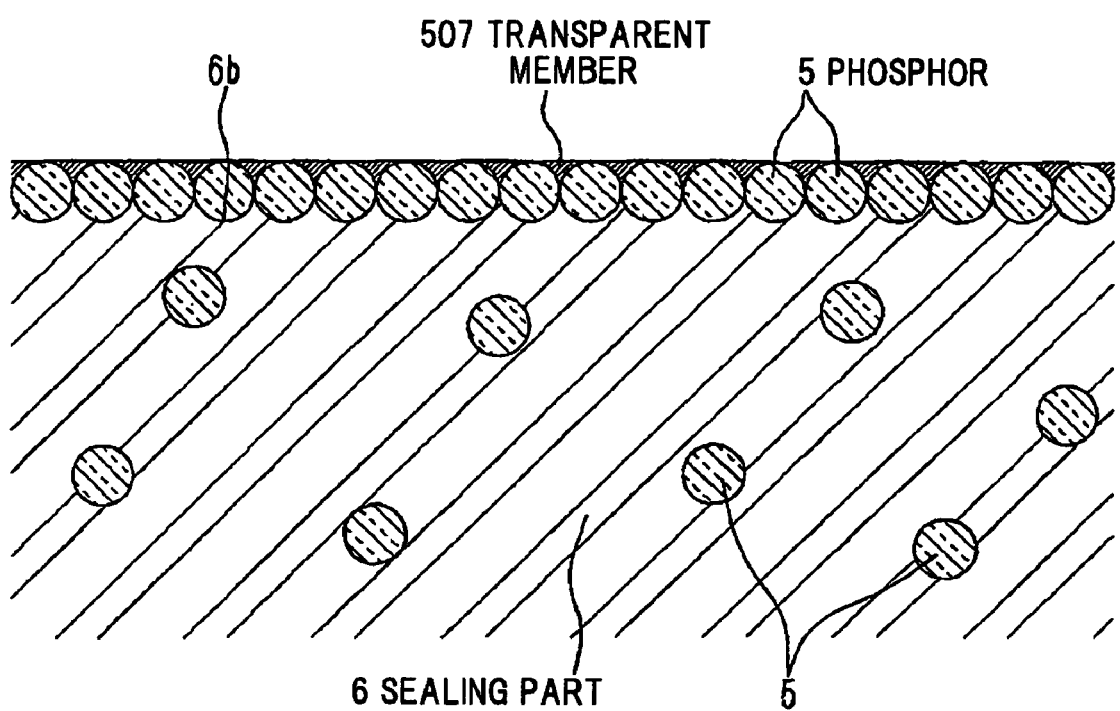
FIG. 11 is an enlarged cross sectional view showing a sealing part and a transparent member in FIG. 10.

FIG. 11 is an enlarged cross sectional view showing the sealing part 6 and the transparent member 507 in FIG. 10.

As shown in FIG. 11, the transparent member 507 includes a phosphor layer formed of single-layer phosphors 5, and is formed to cover the top surface 6b of the sealing part 6. In this embodiment, each bottom of the phosphors 5 included in the transparent member 507 is buried in the glass material of the sealing part 6.

Figure 12:
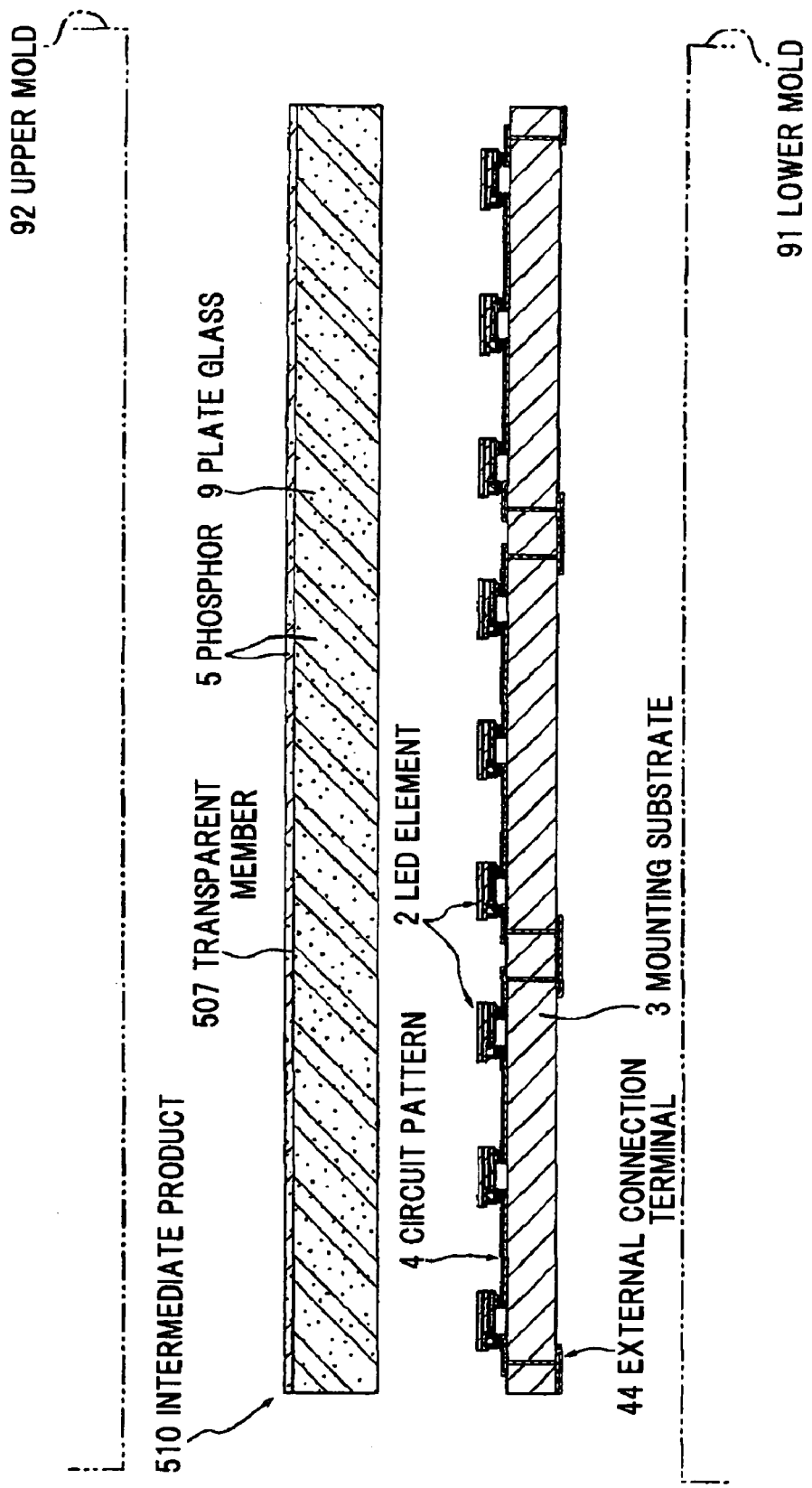
FIG. 12 is a cross sectional view showing a production method of an intermediate product.

A method of producing the light emitting device 501 will be explained below referring to FIGS. 12 and 13. FIG. 12 is a cross sectional view showing the production method of an intermediate product.

As shown in FIG. 12, a plate glass 9 is prepared which includes the phosphor 5 at concentration of 'a' therein and has a thickness corresponding with the vertical length t1. On the top surface of the plate glass 9, the transparent member 507 is coated which is formed of inorganic paste containing an organic material and includes the phosphor 5 at concentration of 'b' therein. Separately from the plate glass 9, the plural LED elements 2 are electrically bonded by using Au bump onto the surface pattern 41 of the circuit pattern 4 on the mounting substrate 3. Then, the mounting substrate 3 with the LED elements 2 mounted thereon is placed on the lower mold 91 and the plate glass 9 with the transparent member 507 coated thereon is placed on the upper mold 92.

Figure 13:
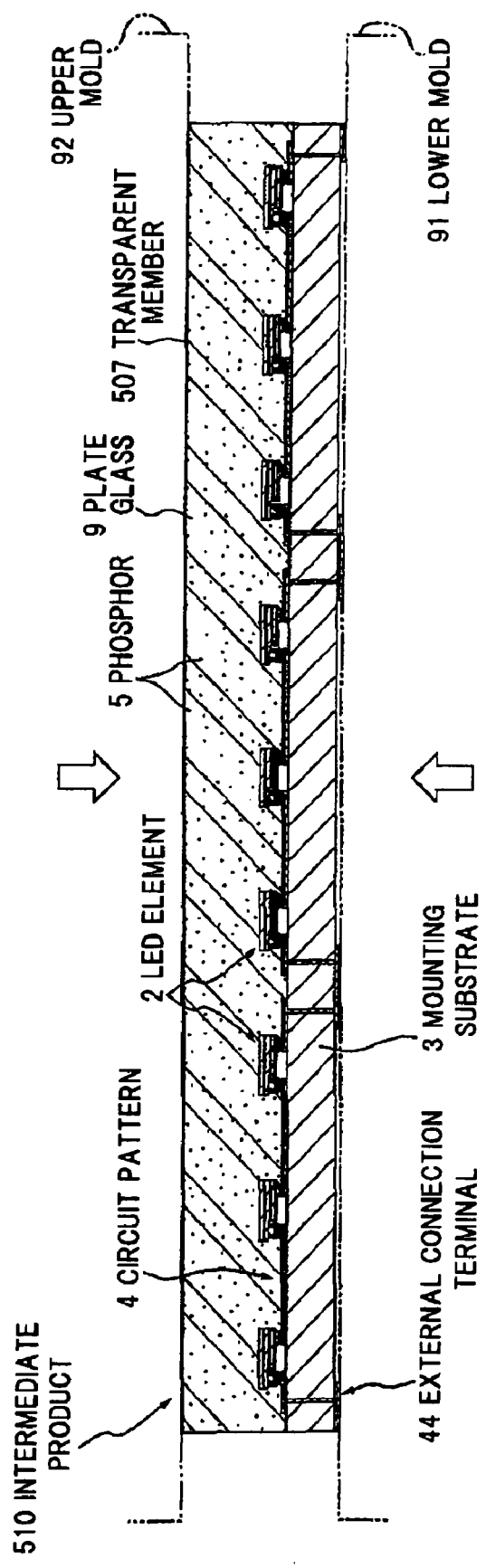
FIG. 13 is a cross sectional view showing the intermediate product before it is separated into plural light emitting devices by the dicer.

FIG. 13 is a cross sectional view showing the intermediate product before it is separated into plural light emitting devices by the dicer.

Then, as shown in FIG. 13, while the plate glass 9 is stacked on the mounting surface 3a of the mounting substrate 3, the lower mold 91 and the upper mold 92 are pressed against each other in nitrogen atmosphere by hot pressing. Thereby, the plate glass 9 is fusion-bonded to the mounting substrate 3 with the LED elements 2 mounted thereon, so that the LED elements 2 on the mounting substrate 3 can be sealed with the plate glass 9. During this process, the organic material included in the inorganic paste of the transparent member 507 evaporates and the transparent member 507 is sintered on the plate glass 9. Along with this, the phosphor 5 in the transparent member 507 is buried in the tope surface of the plate glass 9 by pressure applied in the hot pressing. Thus, the intermediate product 510 is prepared where the plural light emitting devices 501 are not separated yet. Then, the mounting substrate 3 with the sealing part 6 united therewith is set in the dicer, which allows it to be divided into the separate light emitting device 501 composed of the LED elements 2.

In the light emitting device 501 thus composed, the transparent member 507 has the phosphor 5 dispersed therein at concentration higher than the sealing part 6. Therefore, the difference in chromaticity can be further reduced between light discharged from the side faces 6a of the sealing part 6 and light discharged from the transparent member 507. Further, since the vertical dimension of the transparent member 507 is smaller than the difference between the lateral length L and the vertical length t1 of the sealing part 6, the device can be downsized as well as the reduced difference in chromaticity.

Further, since the sintering of the transparent member 507 is concurrently conducted with the glass sealing of the LED elements 2, the number of steps required for the production can be reduced so as to lower the manufacturing cost. During the hot pressing, since the phosphor 5 in the transparent member 507 is buried in the sealing part 6, the transparent member 507 can be thinned while surely bonding the phosphor 5 to the sealing part 6. Alternatively, the plate glass 9 with the transparent member 507 coated thereon may be previously baked such that the sealing is conducted by using the plate glass 9 with the transparent member 507 thus sintered. Thereby, the phosphor 5 can be surely bonded to the sealing part 6.

Figure 14:
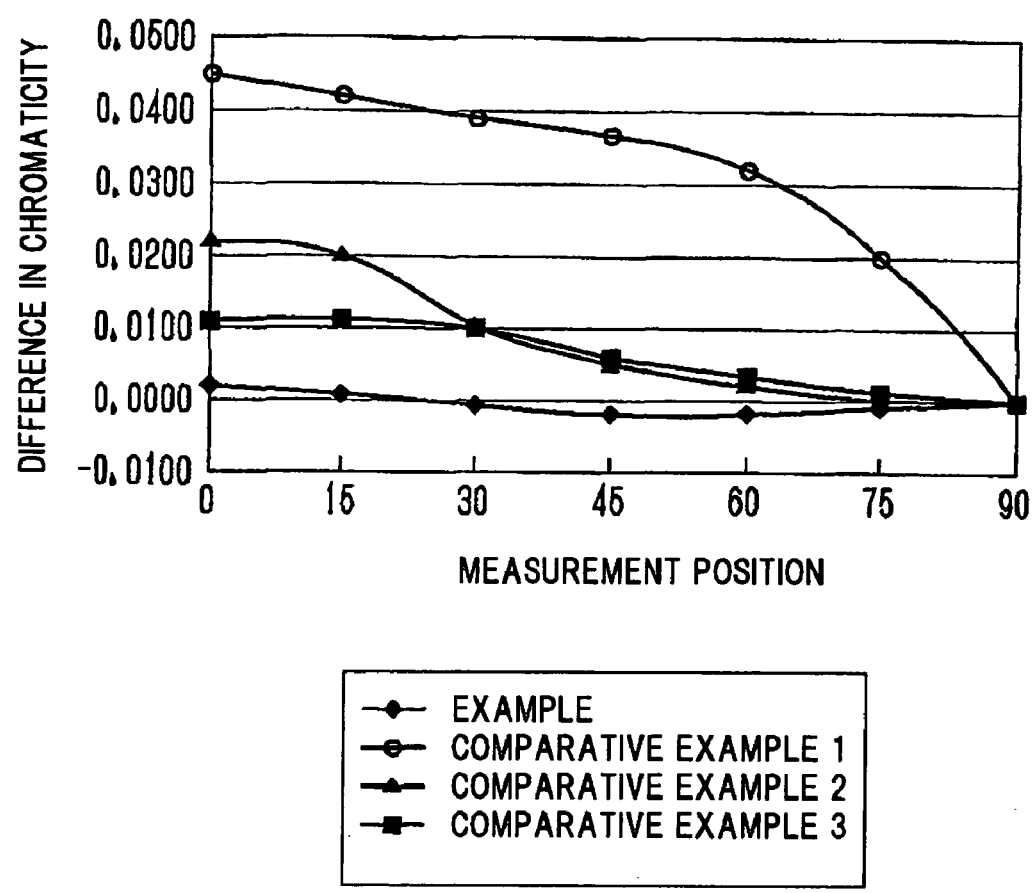
FIG. 14 is a graph showing chromaticity distribution of the light emitting device of the fifth embodiment.

FIG. 14 is a graph showing chromaticity distribution of the light emitting device of the fifth embodiment. As shown in FIG. 14, the lateral axis of the graph represents an angle (or measurement position) defined to the optical axis of the light emitting device, the vertical axis thereof represents a difference in chromaticity for a chromaticity coordinate value x by reference to 90 degrees. In FIG. 14, 'Example' exhibits data in a light emitting device prepared such that the phosphor concentration of the sealing part is 2.4% by weight and the phosphor concentration of the transparent member is 90% or more by weight.

The transparent member of Example is prepared such that a silicon compound is used as the inorganic paste, and ethyleneglycolmonophenylether etc. is used as the organic material. The transparent member is coated on the surface of the plate glass by screen printing. The organic material can be arbitrarily selected and may be aromatic compounds. In the screen printing, a screen mesh of 20 μm is used which is coarser than the average diameter (10 μm) of the phosphor. The phosphor concentration at the printing is set 68% by weight, and the thickness of the transparent member is set 20 μm. After the prebaking of the transparent member is conducted at 100° C. for 1 hour, the glass sealing of the LED element and the baking of the transparent member are concurrently conducted during the hot pressing. Although the phosphor concentration before the baking is 68% by weight, the phosphor concentration after the baking becomes 90% or more by weight since most of the paste in the transparent member evaporates by the baking.

As shown in FIG. 14, Example thus obtained provides the result that the absolute values of chromaticity difference for chromaticity coordinate x are not more than 0.003 in the range of 0 to 90 degrees, where uniform white light can be observed with the naked eyes in the range of 0 to 90 degrees. For example, the chromaticity difference for chromaticity coordinate x by reference to 90 degrees is 0.0017 at 0 degree, 0.0007 at 15 degrees, −0.0007 at 30 degrees, −0.0022 at 45 degrees, −0.0025 at 60 degrees, and −0.0018 at 75 degrees.

In FIG. 14, 'Comparative Example 1' exhibits data in a light emitting device prepared such that the phosphor concentration of the sealing part is 2.4% by weight and no transparent member is equipped. As shown in FIG. 14, Comparative Example 1 provides the result that the absolute value of chromaticity difference is beyond 0.04, where yellow light can be observed with the naked eyes near 0 degree and blue light near 90 degrees. For example, the chromaticity difference for chromaticity coordinate x by reference to 90 degrees is 0.0447 at 0 degree, 0.0422 at 15 degrees, 0.0390 at 30 degrees, 0.0368 at 45 degrees, 0.0319 at 60 degrees, and 0.0200 at 75 degrees.

In FIG. 14, 'Comparative Example 2' exhibits data in a light emitting device prepared such that a 1 mm square LED element is used, the LED element is sealed with resin and in the sealing resin the phosphor is precipitated near the LED element. In Comparative Example 2, the chromaticity difference is beyond 0.02 near 0 degree.

In FIG. 14, 'Comparative Example 3' exhibits data in a light emitting device prepared such that the 1 mm square LED element is used, the LED element is sealed with resin and the phosphor layer is formed on the surface of the LED element by screen printing. In Comparative Example 3, the chromaticity difference is beyond 0.01 near 0 degree.

Thus, in Example, as compared to Comparative Examples 1-3, unevenness in chromaticity according to the angle can be significantly reduced. Further, although in Comparative Examples 1-3 the chromaticity decreases according as the angle to the optical axis increases, in Example the chromaticity decreases from 0 degree to 45 degrees and increases from 45 degrees to 90 degrees. Thus, the unevenness in chromaticity according to the angle is different from each other.

Sixth Embodiment

Figure 15:
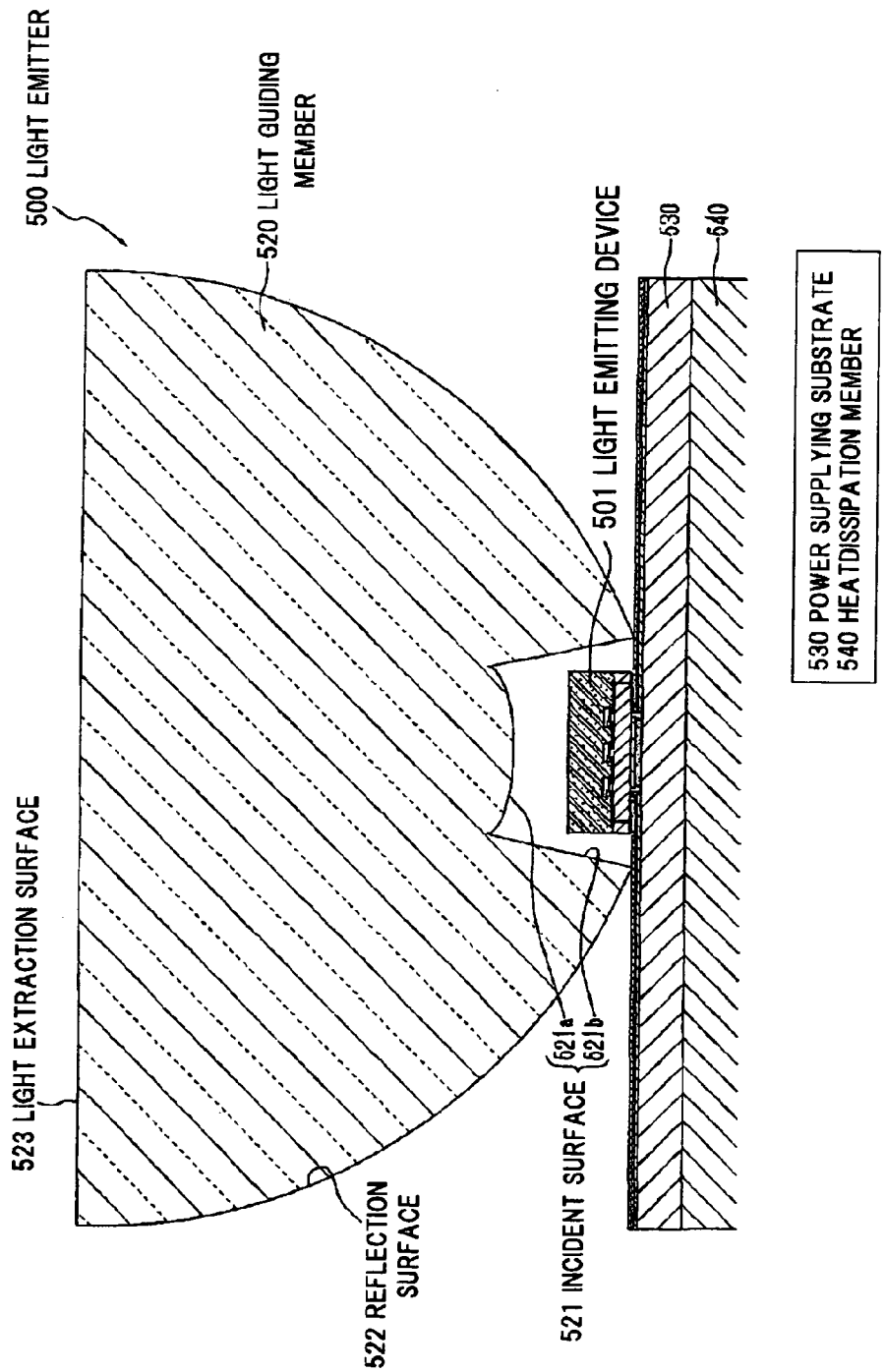
FIG. 15 is a cross sectional view showing a light emitter in a sixth preferred embodiment according to the invention.
Figure 16:
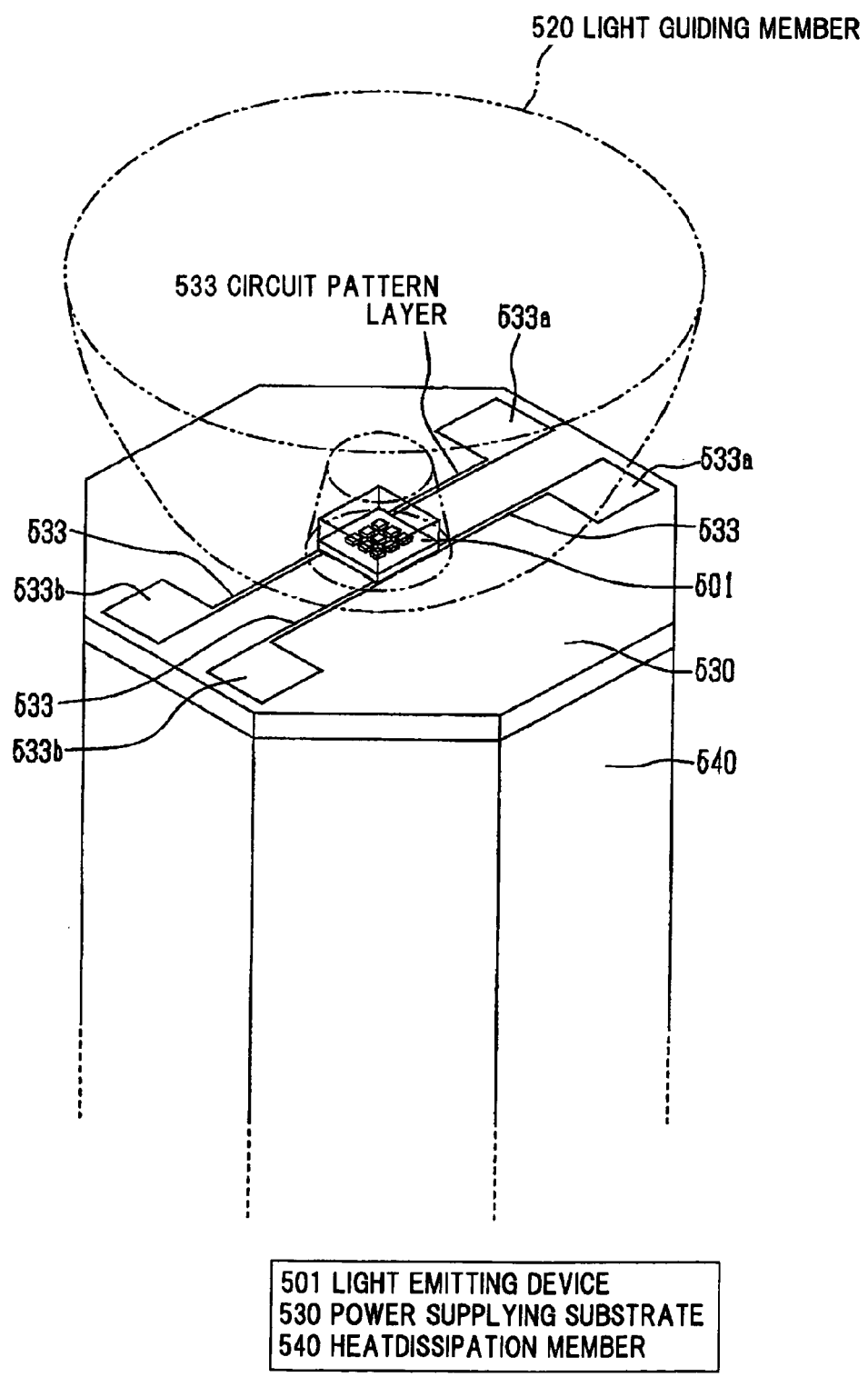
FIG. 16 is a perspective view showing the light emitter in FIG. 15.

FIGS. 15 to 17 illustrate the sixth preferred embodiment according to the invention. FIG. 15 is a cross sectional view showing a light emitter in the sixth embodiment.

As shown in FIG. 15, the light emitter 500 comprises a light emitting device 501, a light guiding member 520 for guiding light emitted from the light emitting device 501, a power supplying substrate 530 for supplying power to the light emitting device 501, and a heat dissipation member 540 attached on the bottom of the power supplying substrate 530. The light emitting device 501 is the same as described in the fifth embodiment.

The light guiding member 520 is formed of a transparent rein such as acrylic resin, contacts the upper surface of the power supplying substrate 530, and formed to gradually increase in diameter or width upward from the power supplying substrate 530 side. The light guiding member 520 is, on the power supplying substrate 530 side, provided with a concave portion for housing the light emitting device 501 which protrudes on the power supplying substrate 530. The light guiding member 520 further comprises an incident surface 521 which forms the surface of the concave portion and through which light emitted from the light emitting device 501 enters into the light guiding member 520, a reflection surface 522 which forms the side face of the light guiding member 520 and reflects a part of light entering through the incident surface 521, and a light extraction surface 523 which forms the upper surface of the light guiding member 520 and through which light entered in the light guiding member 520 is discharged.

The incident surface 521 may be composed of a lens surface 521a which is formed above the light emitting device 501 and concave in top view thereof, and a conical side face 521b which is formed to gradually increase in diameter or width downward from the outer edge of the lens surface 521a. By the light guiding member 520, light emitted laterally from the light emitting device 501 is refracted at the conical side face 521b to come close to the central axis. Therefore, the incident angle of light incident to the reflection surface 522 can be increased to enhance the light extraction efficiency.

The reflection surface 522 is shaped like a paraboloidal surface with the light emitting device 501 at the apex, and serves to reflect light emitted from the light emitting device 501 in direction substantially perpendicular to the power supplying substrate 530. The light extraction surface 523 is formed parallel to the power supplying substrate 530. The reflection surface 522 of the light guiding member 520 forms an emission surface by light emitted from the light emitting device 501.

FIG. 16 is a perspective view showing the light emitter in FIG. 15. In FIG. 16, the light guiding member 520 is indicated by two-dot chain line.

As shown in FIG. 16, the power supplying substrate 530 is formed a regular polygon in top view and mounted with the light emitting device 501 at the center. On the surface of the power supplying substrate 530, a circuit pattern layer 533 is exposed which is electrically connected to the light emitting device 501. The circuit pattern layer 533 is extended to both sides from the mounting site of the light emitting device 501, and forms an anode electrode 533a and a cathode electrode 533b near the edges of the power supplying substrate 530. In this embodiment, the anode electrode 533a and the cathode electrode 533b are two by two formed and they are each electrically connected to the light emitting device 501 independently from each other.

FIG. 17 is an enlarged cross sectional view showing a part of the light emitter in FIG. 15.

As shown in FIG. 17, the power supplying substrate 530 comprises a metal base portion 531, an insulation layer 532, the circuit pattern layer 533, and a white resist layer 534 which are formed in this order from the bottom side. The metal base portion 531 is made of, e.g., copper and serves to dissipate heat generated from the light emitting device 501 as well as providing the power supplying substrate 530 with rigidity. The metal base portion 531 is connected through a solder material 537 to the heat dissipation pattern 45. In other words, the heat dissipation member 540 is indirectly connected through the metal base portion 531 to the heat dissipation pattern 45. The bottom of the metal base portion 531 is bonded to the heat dissipation member 540 made of copper etc. The insulation layer 532 is made of polyimide resin, epoxy resin etc. and serves to insulate the circuit pattern 533 from the metal base portion 531 electrically conductive. The insulation layer 532 is not formed in area corresponding to the heat dissipation pattern 45. In this area, it is intended to dissipate heat directly to the metal base portion 531 not through the insulation layer 532 with low heat conductivity. The circuit pattern layer 533 is made of, e.g., copper with gold film thereon, and connected through a solder material 536 to the back surface pattern 42 of the light emitting device 501. The white resist layer 534 is made of, e.g., epoxy resin with fillers of titanium oxide mixed therein, and serves to enhance the reflectivity of the upper surface of the power supplying substrate 530.

The light emitter 500 thus composed may have unevenness in emission color on the light extraction surface that is highly influenced by the directional dependency of chromaticity in the light emitting device 501. However, since the light emitting device 501 of this embodiment is low in the directional dependency of chromaticity, the light emitter 500 including the focusing optical system such as the light guiding member 520 can suppress the unevenness in emission color. Further, since the light emitting device 501 is low-profile, the solid angle of the light emitting device 501 decreases which is viewed from the reflection surface 522 disposed in the large angle range up to 90 degrees defined to the central axis of the light emitting device 501. Therefore, the increase in solid angle caused by the increased size of the light source can be prevented so that the light distribution property can be increased in collection power.

Heat generated from the LED elements 2 of the light emitting device 501 is transmitted through the heat dissipation pattern 45, the metal base portion 531 to the heat dissipation member 540. In this embodiment, with the heat dissipation member 540 elongated downward, the thermal capacity can be increased for the small area (in top view) of the light emitting device 501 so that the light emitter 500 can have the good heat dissipation performance. Therefore, larger power can be supplied to the LED elements 2 to have more light output so that the light emitting device 501 can be used as a high-brightness light source. Thus, the light emitting device 501 used as a high-brightness light source can be suitably applied to the light emitter 500 which radiates focused light by using the focusing optical system.

Seventh Embodiment

FIGS. 18 and 19 illustrate the seventh preferred embodiment according to the invention. FIG. 18 is a cross sectional view showing a light emitter in the seventh embodiment.

As shown in FIG. 18, the light emitter 600 comprises the light emitting device 501, a light guiding member 620 for guiding light emitted from the light emitting device 501, a power supplying substrate 630 for supplying power to the light emitting device 501, and a heat dissipation member 640 attached on the bottom of the power supplying substrate 530. The light emitting device 501 is the same as described in the fifth embodiment.

The light guiding member 620 is formed of a transparent rein such as ABS, and has a reflection surface that contacts the upper surface of the power supplying substrate 530, surrounds laterally the light emitting device 501 and is formed to gradually increase in diameter or width upward from the power supplying substrate 630 side. The reflection surface of the light guiding member 620 is composed of a metal layer 621 that is formed of high-reflectivity metal such as aluminum.

FIG. 19 is an enlarged cross sectional view showing a part of the light emitter in FIG. 18.

The power supplying substrate 630 is formed with a polyimide-based flexible substrate, and comprises a first polyimide layer 632, a circuit pattern layer 633, and a second polyimide layer 634 which are formed in this order from the bottom side. The power supplying substrate 630 may be liquid crystal polymer-based. The circuit pattern layer 633 is connected through a solder material 636 to the back surface pattern 42 of the light emitting device 501. The power supplying substrate 630 has a hole 630a formed corresponding to the heat dissipation pattern 45 of the light emitting device 501.

The heat dissipation member 640 is formed of copper etc. and has a protrusion 641 which protrudes inside the hole 630a of the power supplying substrate 630. The heat dissipation pattern 45 of the light emitting device 501 is bonded through a solder material 637 to the protrusion 641. Thus, the heat dissipation member 640 is directly connected to the heat dissipation pattern 45.

The light emitter 600 thus composed allows the light emitting device 501 to emit light with difference in chromaticity almost eliminated, and of the emitted light, light heading to the reflection surface of the light guiding member 620 can be reflected thereon to travel upward. Heat generated from the LED elements 2 of the light emitting device 501 is transmitted from the heat dissipation pattern 45 directly to the heat dissipation member 640. Therefore, the light emitter 600 can have the good heat dissipation performance. Further, in the light emitter 600, since the power supplying substrate 630 only has to be mounted on the heat dissipation member 640, the workability during the production can be improved.

Further, since the power supplying substrate 630 is formed with the flexible substrate, stress can be relaxed that may arise between the light emitting device 501 and the heat dissipation member 640 which are different in thermal expansion coefficient (α) from each other, so that the disconnection of wire can be prevented during heat cycles. Especially, when the power supplying substrate 630 just under the light emitting device 501 is disposed not to be restrained by the heat dissipation member 640 without being bonded to the heat dissipation member 640, the stress can be effectively relaxed since power supplying substrate 630 can be freely moved.

Further, since the heat dissipation member 640 is provided with the protrusion corresponding to the heat dissipation pattern 45 of the light emitting device 501, gap in height on the mounting surface can be reduced and the protrusion can be positioned to be fitted inside the hole 630a of the power supplying substrate 630, so that the mounting can be stably conducted. Further, by reducing the thickness of the solder material 637, heat resistance caused by the solder material 637 can be reduced. Thus, even when the solder material 637 is in thermal conductivity lower than the heat dissipation member 640, the heat transfer capability is not impaired.

Although in the first to seventh embodiments the mounting substrate is formed of alumina ($Al_2O_3$), it may be made of ceramics other than alumina, e.g., it may be formed with a W—Cu substrate. Although in the embodiments the light emitting device is mounted with the plural LED elements, it may be mounted with one LED element as shown in FIG. 20.

Although in the first to seventh embodiments the LED element 2 is comprised of GaN-based semiconductor material, it may be comprised of another material such as ZnSe-based or SiC-based material. In addition, the light emitting element is not limited to the LED element.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
  a light emitting element;
  a substrate comprising a flat mounting surface for mounting the light emitting element thereon;
  a sealing part for the light emitting element on the mounting surface of the substrate, the sealing part comprising glass including a phosphor to be excited by light emitted from the light emitting element to radiate a wavelength conversion light, the sealing part being shaped like a rectangular solid wherein a lateral length is defined as a distance between a center of a bottom surface of the sealing part bonded to the mounting surface and a side face perpendicular to the mounting surface, a vertical length is defined as a distance between the mounting surface and a top surface of the sealing part, and at least one of the lateral length is longer than the vertical length; and a transparent member formed on the top surface of the sealing part with a vertical dimension, the transparent member including the phosphor at a concentration higher than the sealing part, wherein the device satisfies the relationship:

$$(L \times a) \leq (t1 \times a + t2 \times b) \leq (L \times a) \times \sqrt{2}$$

where L represents the lateral length, t1 represents the vertical length, a represents the concentration of the phosphor per unit volume in the sealing part, t2 represents the vertical dimension, and b represents the concentration of the phosphor per unit volume in the transparent member.

2. The light emitting device according to claim 1, wherein:
the vertical dimension is smaller than a difference between the lateral length and the vertical length, and
the light emitting element comprises a plurality of light emitting elements.

3. The light emitting device according to claim 2, wherein:
the substrate comprises a heat dissipation pattern on a back surface opposite the mounting surface, and
the light emitting device further comprises a heat dissipation member connected directly or indirectly to the heat dissipation pattern.

4. The light emitting device according to claim 3, wherein:
the transparent member comprises glass.

5. The light emitting device according to claim 4, wherein:
the transparent member further comprises inorganic paste.

6. The light emitting device according to claim 5, wherein:
the sealing part comprises the top surface and the bottom surface which are both shaped like a square, and
the two lateral lengths of the sealing part are equal to each other.

7. The light emitting device according to claim 6, wherein:
the sealing part comprises the top surface and the bottom surface which are both shaped like a rectangle with an elongated side in a direction, and
the sealing part further comprises a reflection member on the elongated side.

8. The light emitting device according to claim 4, wherein:
the transparent member further comprises resin.

9. The light emitting device according to claim 4, wherein:
the light emitting element is adapted to emit light with a wavelength not more than 410nm, and
the phosphor is adapted to radiate blue, green and red lights as the wavelength conversion light.

10. The light emitting device according to claim 4, wherein:
the light emitting element is adapted to emit light in a blue region, and
the phosphor is adapted to radiate yellow light as the wavelength conversion light.

11. The light emitting device according to claim 4, wherein:
40% or more of the mounting surface of the substrate is covered with silver.

12. A light emitter, comprising:
the light emitting device according to claim 4; and
an emission surface to cause emission of light emitted from the light emitting device.

13. The light emitting device according to claim 1, wherein the vertical dimension is smaller than a difference between the lateral length and the vertical length.

14. The light emitting device according to claim 1, wherein the transparent member has a rectangular shape.

15. The light emitting device according to claim 14, wherein the transparent member extends along the top surface of the sealing part.

16. The light emitting device according to claim 1, wherein the transparent member comprises glass.

17. The light emitting device according to claim 1, wherein the top surface of the sealing part and the bottom surface of the sealing each have a square shape.

18. The light emitting device of claim 1, wherein the transparent member comprises a $ZnO$—$SiO_2$—$R_2O$ based glass, wherein R comprises at least one of Li, Na, and K.

19. The light emitting device of claim 1, wherein the light emitting element comprises one of a plurality of light emitting elements arranged in an array.

20. The light emitting device of claim 19, wherein the light emitting elements are arranged symmetrically to the center of a bottom surface of the sealing part.

21. The light emitting device of claim 19, wherein the light emitting elements are arranged at intervals broader than the mounting substrate.

22. A light emitting device, comprising:
a fight emitting element;
a substrate comprising a flat mounting surface for mounting the light emitting element thereon;
a sealing part for the light emitting element on the mounting surface of the substrate, the sealing part comprising glass including a phosphor to be excited by light emitted from the light emitting element to radiate a wavelength conversion light, the sealing part being shaped like a rectangular solid wherein a lateral length is defined as a distance between a center of a bottom surface of the sealing part bonded to the mounting surface and a side face perpendicular to the mounting surface, a vertical length is defined as a distance between the mounting surface and a top surface of the sealing part, and at least one of the lateral length is longer than the vertical length; and a transparent member formed on the top surface of the sealing part, the transparent member including the phosphor at a concentration higher than the sealing part, wherein the device satisfies the relationship:

$$L \times a = t1 \times a + t2 \times b,$$

where L represents the lateral length, t1 represents the vertical length, a represents the concentration of the phosphor per unit volume in the sealing part, t2 represents the vertical dimension, and b represents the concentration of the phosphor per unit volume in the transparent member.

23. A light emitting device, comprising:
a light emitting element;
a rectangular sealing part, including a phosphor, disposed on the light emitting element, wherein a lateral length is defined as a distance between a center of the sealing part and a side face of the sealing part, the lateral length being longer than a vertical length of the sealing part; and a transparent member formed on a top surface of the sealing part with a vertical dimension, the transparent member including the phosphor at a concentration higher than the sealing part,
wherein the device satisfies the relationship:

$$(L \times a) \leq (t1 \times a + t2 \times b) \leq (L \times a) \times \sqrt{2}$$

where L represents the lateral length, t1 represents the vertical length, a represents the concentration of the phosphor per unit volume in the sealing part, t2 represents the vertical dimension, and b represents the concentration of the phosphor per unit volume in the transparent member.

24. The light emitting device according to claim 23, wherein the vertical dimension is smaller than a difference between the lateral length and the vertical length.

* * * * *